(12) United States Patent
Lenski et al.

(10) Patent No.: US 7,906,385 B2
(45) Date of Patent: Mar. 15, 2011

(54) METHOD FOR SELECTIVELY FORMING STRAIN IN A TRANSISTOR BY A STRESS MEMORIZATION TECHNIQUE WITHOUT ADDING ADDITIONAL LITHOGRAPHY STEPS

(75) Inventors: Markus Lenski, Dresden (DE); Frank Wirbeleit, Dresden (DE); Anthony Mowry, Buda, TX (US)

(73) Assignee: GlobalFoundries Inc., Grand Cayman (KY)

( * ) Notice: Subject to any disclaimer, the term of this patent is extended or adjusted under 35 U.S.C. 154(b) by 134 days.

(21) Appl. No.: 12/179,116

(22) Filed: Jul. 24, 2008

(65) Prior Publication Data

US 2009/0197381 A1    Aug. 6, 2009

(30) Foreign Application Priority Data

Jan. 31, 2008   (DE) .......................... 10 2008 007 003

(51) Int. Cl.
*H01L 21/8238*   (2006.01)
(52) U.S. Cl. ........ 438/199; 438/229; 438/230; 438/486; 257/E21.632; 257/E21.634; 257/E21.64
(58) Field of Classification Search .................. 438/199, 438/229, 230, 482, 486; 257/E21.632, E21.633, 257/E21.634, E21.64
See application file for complete search history.

(56) References Cited

U.S. PATENT DOCUMENTS

| | | | |
|---|---|---|---|
| 7,052,946 B2 | 5/2006 | Chen et al. | 438/199 |
| 2004/0092063 A1 | 5/2004 | Okumura et al. | 438/199 |
| 2006/0099765 A1* | 5/2006 | Yang | 438/301 |
| 2008/0026572 A1* | 1/2008 | Wirbeleit et al. | 438/663 |
| 2008/0153221 A1* | 6/2008 | Sridhar et al. | 438/230 |
| 2009/0294866 A1* | 12/2009 | Eller et al. | 257/369 |

FOREIGN PATENT DOCUMENTS

| | | |
|---|---|---|
| DE | 102006035646 B3 | 3/2008 |
| DE | 102007057687 A1 | 6/2009 |

OTHER PUBLICATIONS

Translation of Official Communication from German Patent Office for German Patent Application No. 10 2008 007 003.3 dated Aug. 20, 2009.
Wiatr et al., "Review on Process-Induced Strain Techniques for Advanced Logic Technologies," Advanced Thermal Processing of Semiconductors 2007, RTP 2007, 15$^{th}$ International Conference, pp. 19-29, Oct. 2007.
Translation of Official Communication from German Patent Office for German Patent Application No. 10 2008 007 003.3 dated Oct. 27, 2008.

* cited by examiner

*Primary Examiner* — Michael S Lebentritt
*Assistant Examiner* — Daniel Whalen
(74) *Attorney, Agent, or Firm* — Williams, Morgan & Amerson, P.C.

(57) ABSTRACT

A selective stress memorization technique is disclosed in which the creation of tensile strain may be accomplished without additional photolithography steps by using an implantation mask or any other mask required during a standard manufacturing flow, or by providing a patterned cap layer for a strained re-crystallization of respective drain and source areas. In still other aspects, additional anneal steps may be used for selectively creating a crystalline state and a non-crystalline state prior to the re-crystallization on the basis of a cap layer. Thus, enhanced strain may be obtained in one type of transistor while not substantially negatively affecting the other type of transistor without requiring additional photolithography steps.

6 Claims, 14 Drawing Sheets

METHOD FOR SELECTIVELY FORMING STRAIN IN A TRANSISTOR BY A STRESS MEMORIZATION TECHNIQUE WITHOUT ADDING ADDITIONAL LITHOGRAPHY STEPS

BACKGROUND

1. Field of the Disclosure

Generally, the present disclosure relates to the formation of integrated circuits, and, more particularly, to the formation of transistors having strained channel regions by using stress memorization techniques to enhance charge carrier mobility in the channel region of a MOS transistor.

2. Description of the Related Art

Integrated circuits typically include a very large number of circuit elements, such as transistors, capacitors and the like, wherein field effect transistors are frequently used as transistor elements, in particular when complex digital circuit portions are considered. Generally, a plurality of process technologies are currently practiced, wherein, for complex circuitry, such as microprocessors, storage chips and the like, CMOS technology is currently one of the most promising approaches for forming field effect transistors due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed close to the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, the conductivity of the channel region is a dominant factor determining the performance of MOS transistors.

The continuing shrinkage of the transistor dimensions, such as reducing the channel length and thus the channel resistance per unit length, however, involves a plurality of issues associated therewith, such as reduced controllability of the channel, also referred to as short channel effects, and the like, that have to be addressed so as to not unduly offset the advantages obtained by steadily decreasing the channel length of MOS transistors. The continuous size reduction of the critical dimensions, i.e., the gate length of the transistors, necessitates the adaptation and possibly the new development of highly complex process techniques, for example, for compensating for short channel effects. It has, therefore, been proposed to also enhance the channel conductivity of the transistor elements by increasing the charge carrier mobility in the channel region for a given channel length, thereby offering the potential for achieving a performance improvement that is comparable with the advance to a future technology node while avoiding or at least postponing many of the problems encountered with the process adaptations associated with device scaling.

One efficient mechanism for increasing the charge carrier mobility is the modification of the lattice structure in the channel region, for instance, by creating tensile or compressive stress in the vicinity of the channel region to produce a corresponding strain in the channel region, which results in a modified mobility for electrons and holes, respectively. For example, creating uniaxial tensile strain in the channel region along the channel length direction for a standard crystallographic orientation increases the mobility of electrons, which, in turn, may directly translate into a corresponding increase in the conductivity. On the other hand, uniaxial compressive strain in the channel region for the same crystalline configuration may increase the mobility of holes, thereby providing the potential for enhancing the performance of P-type transistors. The introduction of stress or strain engineering into integrated circuit fabrication is therefore an extremely promising approach for further device generations, since strained silicon may be considered as a "new" type of semiconductor material, which may enable the fabrication of fast, powerful semiconductor devices without requiring expensive semiconductor materials, while many of the well-established manufacturing techniques may still be used.

In some approaches, external stress created by, for instance, permanent overlaying layers, spacer elements and the like is used in an attempt to create a desired strain within the channel region. Although a promising approach, the process of creating the strain in the channel region by applying a specified external stress may depend on the efficiency of the stress transfer mechanism for the external stress provided, for instance, by contact layers, spacers and the like into the channel region to create the desired strain therein. Thus, for different transistor types, differently stressed overlayers have to be provided, which may result in a plurality of additional process steps, wherein, in particular, any additional lithography steps may contribute significantly to the overall production costs.

In still a further approach, a substantially amorphized region may be formed adjacent to the gate electrode at an intermediate manufacturing stage, which may then be re-crystallized in the presence of a "rigid" overlying layer formed above the transistor area. During the anneal process for re-crystallizing the lattice, the growth of the crystal will occur under specific stress conditions created by the overlayer and result in a tensile strained crystal, which may be advantageous for N-channel transistors, as explained above. After the re-crystallization, the sacrificial stress layer may be removed, wherein, nevertheless, a certain amount of strain may be "conserved" in the re-grown lattice portion. This effect is generally known as stress memorization. Although the exact mechanism is not yet fully understood, it is believed that, during the anneal process, the interaction of the rigid overlayer with the highly damaged or amorphous silicon material may suppress a volume reduction of the re-crystallizing silicon lattice, which may therefore remain in a tensile-strained state.

However, the creation of a tensile-strained lattice in the vicinity of the channel region may result in a performance degradation of P-channel transistors, since a uniaxial tensile strain component in the channel region of the P-channel transistor may result in a reduced hole mobility. Therefore, the stress memorization technique is frequently applied in a selective manner by patterning the rigid cap layer so as to expose the P-channel transistors prior to performing the anneal process, thereby adding an additional cost-intensive lithography process, as will be described with reference to FIGS. 1a-1d.

FIG. 1a schematically illustrates a cross-sectional view of a semiconductor device 100 comprising a P-channel transistor 150p and an N-channel transistor 150n, which are formed above a substrate 101 having formed thereabove a silicon-based semiconductor layer 102. The substrate 101, in combination with the silicon-based semiconductor layer 102, may represent a bulk configuration, that is, if the semiconductor layer 102 may represent a part of a crystalline material of the substrate 101, while in other cases a silicon-on-insulator (SOI) configuration may be provided in which the silicon-based semiconductor layer 102 may be formed on an insulating layer (not shown), which may frequently be referred to as a buried insulating layer.

In the manufacturing stage shown in FIG. 1a, the P-channel transistor 150p and the N-channel transistor 150n are shown to have substantially the same configuration, although it should be appreciated that the transistors 150p, 150n may at least differ from each other with respect to the conductivity type, i.e., the type of dopant species used for defining the transistor characteristics of the respective transistors. Thus, the transistors 150p, 150n may comprise a gate electrode 151 formed above a channel region 154 and separated therefrom by a gate insulation layer 152. Moreover, a sidewall spacer structure 153 may be formed on sidewalls of the gate electrode 151. Furthermore, drain and source regions 155 are formed in respective portions of the silicon-based layer 102 in combination with appropriately designed extension regions 155e, thereby defining, in combination with the channel region 154, PN junctions as are required for the transistor behavior of the devices 150p and 150n. In the manufacturing stage shown, the drain and source regions 155 and the extension regions 155e are still in a highly non-crystalline state, that is, at least the drain and source regions 155 may exhibit heavy lattice damage or may be in a substantially amorphous state. As previously explained, after re-crystallizing a heavily damaged or amorphous drain and source region 155 in the presence of an appropriate cap layer, such as a silicon nitride layer, typically a tensile strain may be generated in the channel region 154, thereby significantly enhancing the transistor characteristics of the transistor 150n for a certain crystallographic configuration of the silicon-based layer 102. On the other hand, a tensile strain in the channel region 154 of the P-channel transistor 150p may not be desired, since a certain amount of uniaxial tensile strain in the P-channel transistor 150p may negatively affect the charge carrier mobility therein, as previously explained.

The semiconductor device 100 as shown in FIG. 1a may be formed in accordance with well-established conventional manufacturing techniques. That is, after defining appropriately desired active regions, that is, portions in the silicon-based semiconductor layer 102 having an appropriate size and dopant concentration for forming therein P-channel transistors or N-channel transistors, which may be accomplished on the basis of the formation of isolation structures (not shown), such as trench isolation structures, and establishing a desired dopant concentration as required for P-channel transistors and N-channel transistors, the gate insulation layers 152 and the gate electrodes 151 may be formed. For this purpose, sophisticated deposition and/or oxidation techniques may be used for forming the gate insulation layers 152, followed by the deposition of a gate electrode material. Subsequently, advanced lithography techniques may be used for patterning the gate electrode structures 151 in combination with the gate insulation layers 152. Thereafter, implantation processes may be performed, for instance using an offset spacer (not shown) to define the position of the extension regions 155e with respect to the channel region 154. It should be appreciated that other implantation processes may be performed, such as pre-amorphization implantation for substantially amorphizing exposed portions of the silicon-based layer 102 down to a specified depth. In sophisticated applications, the transistor characteristics may also be determined on the basis of halo implantation processes, during which a dopant species may be introduced having the inverse conductivity type compared to the conductivity type of the extension regions 155e and the drain and source regions 155. It should be appreciated that, during respective implantation processes, such as the halo implantation and the implantation for forming the extension regions 155e for one type of transistors, for instance for the transistor 150p, the transistor 150n is masked by a resist mask which is then removed and replaced by a resist mask covering the transistor 150p and exposing the transistor 150n, which may then receive the appropriate dopant species. Next, the spacer structure 153 may be formed by depositing a liner material, such as silicon dioxide followed by the deposition of a silicon nitride material, which may then be etched to obtain the spacer structure 153. Thereafter, the transistors 150p, 150n are again appropriately masked by photolithography to introduce the respective dopant species for forming the drain and source regions 155 of different conductivity types for the transistors 150p, 150n.

FIG. 1b schematically illustrates the device 100 in an advanced manufacturing stage in which a cap layer 103 comprised of silicon nitride, in combination with an etch stop liner 104, is formed above the transistors 150p, 150n which may be used as a rigid material for selectively creating a tensile strain in the transistor 150n during a respective anneal process. Since a corresponding tensile strain may not be desirable in the transistor 150p, a resist mask 105 is provided so as to expose the transistor 150p. The liner 104 and the cap layer 103 may be formed on the basis of well-established process techniques, such as plasma enhanced chemical vapor deposition (PECVD), followed by a photolithography process for forming the resist mask 105. Thereafter, the exposed portion of the cap layer 103 may be removed on the basis of the resist mask 105 by using appropriate etch chemistries having high selectivity with respect to the etch stop liner 104. For this purpose, well-established wet chemical techniques or plasma assisted removal techniques are available.

FIG. 1c schematically illustrates the device 100 after the above-described process sequence, and with the resist mask 105 removed. Moreover, the device 100 is subjected to an anneal process 106, such as a rapid thermal anneal process (RTA) or any other advanced anneal techniques, such as flashlight anneal or laser anneal techniques that are performed on the basis of appropriately selected process parameters so as to activate the dopant species in the drain and source regions 155 and the extension regions 155e, thereby also substantially re-crystallizing these portions. As explained above, during the anneal process 106, the presence of the cap layer 103 above the transistor 150n may result in a strained state of significant portions of the drain and source regions 155 and 155e, thereby resulting in a desired high strain 154S in the channel region 154. Although the reason for the creation of the strained re-crystallization of the drain and source regions 155 is not yet fully understood, it is believed that the cap layer 103 may act as a rigid material, which may suppress the reduction in volume in the drain and source regions during the re-crystallization process, thereby resulting in a strained state. After removal of the cap layer 103, the tension may still remain, thereby permanently creating the strain 154S in the channel region 154. On the other hand, the drain and source regions 155 and the extension regions 155e in the P-channel transistor 150p may substantially re-grow in a non-strained state, thereby maintaining the channel region 154 in a substantially stress-neutral state. After the anneal process 106, the cap layer 103 may be removed, for instance, by selectively etching the material of the layer 103 with respect to the liner 104 using well-established wet chemical techniques or plasma assisted processes. Thereafter, the liner 104 may be removed and the devices may be prepared for the formation of metal silicide regions.

FIG. 1d schematically illustrates the semiconductor device 100 with metal silicide regions 156 formed in the drain and source regions 155 and in the gate electrodes 151. To this end, well-established silicidation process sequences may be used.

Consequently, by appropriately patterning the cap layer 103 prior to the anneal process 106, the strain 154S may be selectively provided in the N-channel transistor 150n, thereby enhancing the overall transistor characteristics thereof, while substantially not negatively influencing the P-channel transistor 150p, which may have provided therein appropriate strain-inducing mechanisms (not shown), which may provide a different type of strain, or the transistor 150p may be maintained in a substantially strain-neutral state, depending on the device requirements. On the other hand, the additional photolithography step required for patterning the layer 103 may contribute to process complexity, as photolithography steps are typically one of the most cost-intensive process steps due to the high investment costs and cost of ownership for advanced lithography equipment in combination with low cycle times.

The present disclosure is directed to various methods and devices that may avoid, or at least reduce, the effects of one or more of the problems identified above.

SUMMARY OF THE DISCLOSURE

The following presents a simplified summary of the disclosure in order to provide a basic understanding of some aspects disclosed herein. This summary is not an exhaustive overview, and it is not intended to identify key or critical elements of the invention or to delineate the scope of the invention. Its sole purpose is to present some concepts in a simplified form as a prelude to the more detailed description that is discussed later.

Generally, the subject matter disclosed herein relates to techniques for applying a stress memorization regime in a highly selective manner without adding additional photolithography steps, thereby providing a high degree of compatibility with conventional process regimes while not significantly adding to process complexity or cycle time. For this purpose, in some illustrative aspects disclosed herein, the patterning of a cap layer used for the re-crystallization process may be performed on the basis of a masking regime as may be required for the manufacturing process for N-channel transistors and P-channel transistors even if used without a stress memorization technique, thereby avoiding additional photolithography processes. Alternatively or additionally, different types of transistors may be annealed in the presence of a cap layer, wherein a type of transistor, such as a P-channel transistor, may be in a substantially crystalline state, thereby substantially avoiding a strained re-crystallization, which may result in a desired strained state in the other type of transistor.

One illustrative method disclosed herein comprises forming a cap layer above a P-channel transistor and an N-channel transistor. The method further comprises forming a mask above the cap layer, wherein the mask exposes a first portion of the cap layer located above the P-channel transistor and covers a second portion of the cap layer located above the N-channel transistor. Moreover, at least a part of the first portion is removed by using the mask as an etch mask and a P-type dopant species is implanted into the P-channel transistor using the mask as an implantation mask. Finally, the method comprises annealing the P-channel transistor and the N-channel transistor in the presence of the patterned cap layer.

A further illustrative method disclosed herein comprises forming drain and source regions of a first transistor and annealing the first transistor and a second transistor to create a substantially crystalline state in the drain and source regions of the first transistor. The method further comprises introducing an implantation species into the second transistor to create lattice damage adjacent to a channel region of the second transistor. Furthermore, a cap layer is formed above the first and second transistors and the transistors are annealed in the presence of the cap layer so as to substantially re-crystallize the lattice damage.

Yet another illustrative method disclosed herein comprises forming a tensile-stressed dielectric cap layer above an N-channel transistor while exposing a P-channel transistor, wherein the N-channel transistor has drain and source regions in a non-crystalline state. Furthermore, the P-channel transistor and the N-channel transistor are annealed in the presence of the tensile-stressed dielectric cap layer. A compressively stressed dielectric cap layer is formed above the P-channel transistor and an interlayer dielectric material is formed above the tensile-stressed and the compressively stressed dielectric cap layers.

BRIEF DESCRIPTION OF THE DRAWINGS

The disclosure may be understood by reference to the following description taken in conjunction with the accompanying drawings, in which like reference numerals identify like elements, and in which.

Figure 1A:
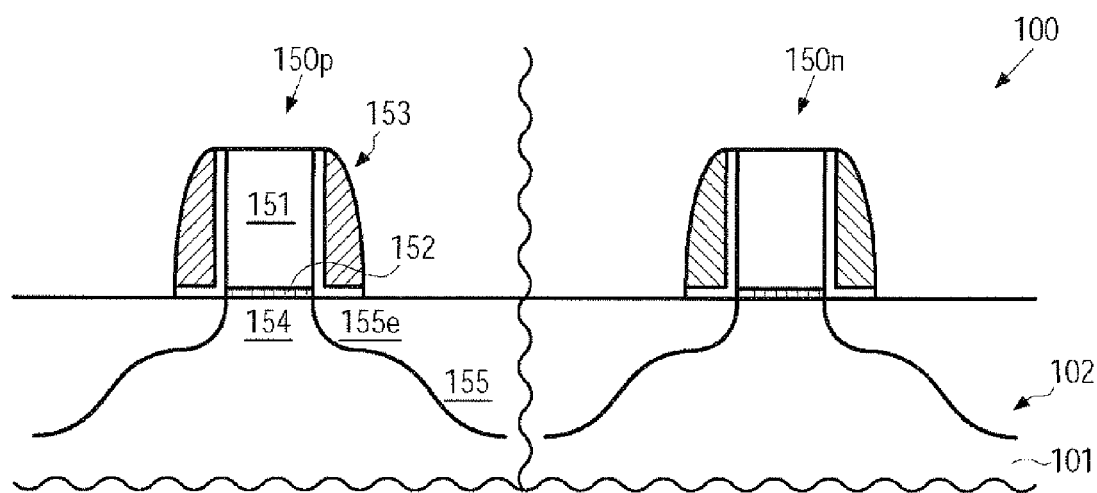
FIGS. 1a-1d schematically illustrate cross-sectional views of a semiconductor device including a P-channel transistor and an N-channel transistor during various manufacturing stages in selectively creating a strain in the N-channel transistor on the basis of a stress memorization technique, according to conventional strategies.
Figure 1B:
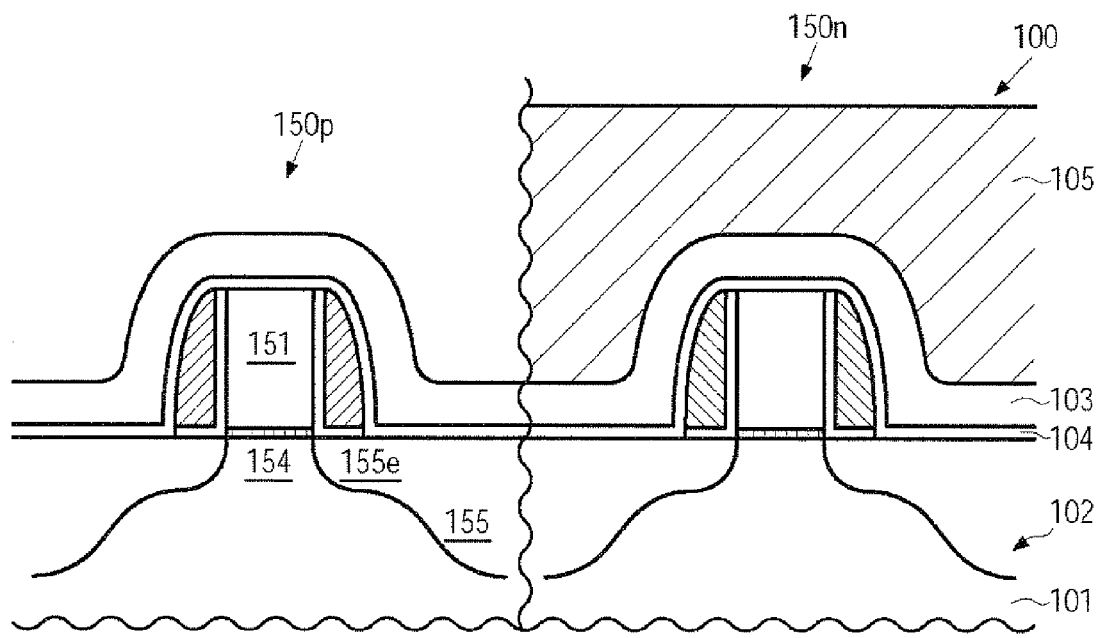
Figure 1C:
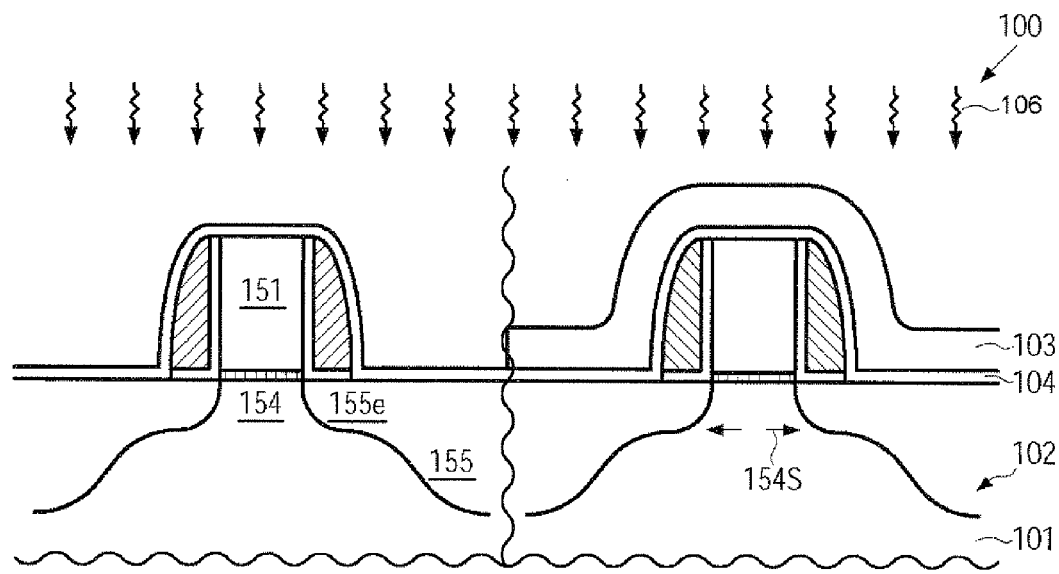
Figure 1D:
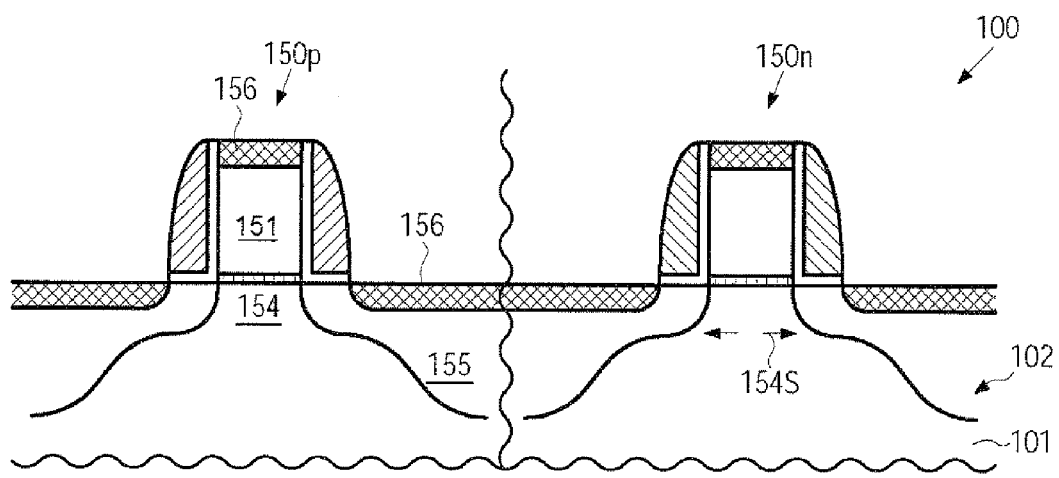

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides a strategy for efficient usage of the stress memorization technique (SMT) during the manufacturing process for forming advanced transistor elements having a strained channel region. Frequently, the generation of a tensile strain in the channel region of certain transistors, such as N-channel transistors when formed in a silicon-based semiconductor layer having a standard crystallographic orientation, i.e., a (100) surface orientation, the stress memorization technique, that is, the re-crystallization of substantially amorphized portions or at least heavily damaged lattice portions in the presence of a rigid material provided in the form of a cap layer, may have to be selectively applied to the various transistor types so as to enhance transistor characteristics of one type of transistor while substantially not negatively affecting the performance of the other type of transistor. For this purpose, the present disclosure contemplates process strategies in which a selectivity of strain may be accomplished on the basis of stress memorization techniques, without adding additional lithography processes, thereby maintaining additional process complexity at a low level, which may directly translate into reduced production costs compared to conventionally applied selective stress memorization techniques. Thus, in some aspects disclosed herein, the patterning of a sacrificial cap layer may be accomplished on the basis of lithography techniques that may have to be applied at any rate for forming the different types of transistors by concurrently using, for instance, an implantation mask as an etch mask for patterning the cap layer. In other cases, other functional layers, such as spacer layers, stressed contact etch stop layers and the like, may be efficiently used as cap layers during appropriately applied anneal processes so as to obtain a selective strain-inducing mechanism. In still other illustrative aspects disclosed herein, the crystalline state of different transistor types may be adjusted such that a substantially crystalline state may be obtained in transistors not requiring additional strain, while a substantially amorphous or highly damaged state may be established in other transistors, such as N-channel transistors, wherein a subsequent stress memorization technique with a non-patterned cap layer may therefore result in a selective creation of strain.

In still other illustrative embodiments, stress memorization techniques performed on the basis of a patterned cap layer or functional layer may be combined with techniques performed on the basis of different crystalline states without requiring a patterned cap layer. Consequently, sophisticated manufacturing techniques may be provided so as to selectively create strain by means of stress memorization techniques without introducing additional photolithography steps. It should be appreciated that the techniques disclosed herein may be advantageously combined with other strain-inducing mechanisms, such as the provision of strained semiconductor materials in drain and source regions and/or channel regions of transistors, stressed dielectric overlayers and the like, since the selective stress memorization techniques described herein may be readily implemented into the overall manufacturing flow without undue additional process complexity as additional photolithography steps are not required. It should, therefore, be appreciated that other stress- or strain-inducing mechanisms may be used, even if the selective stress memorization technique of the present disclosure is described and illustrated as the sole source of creating strain in the following description of further illustrative embodiments.

Figure 2A:
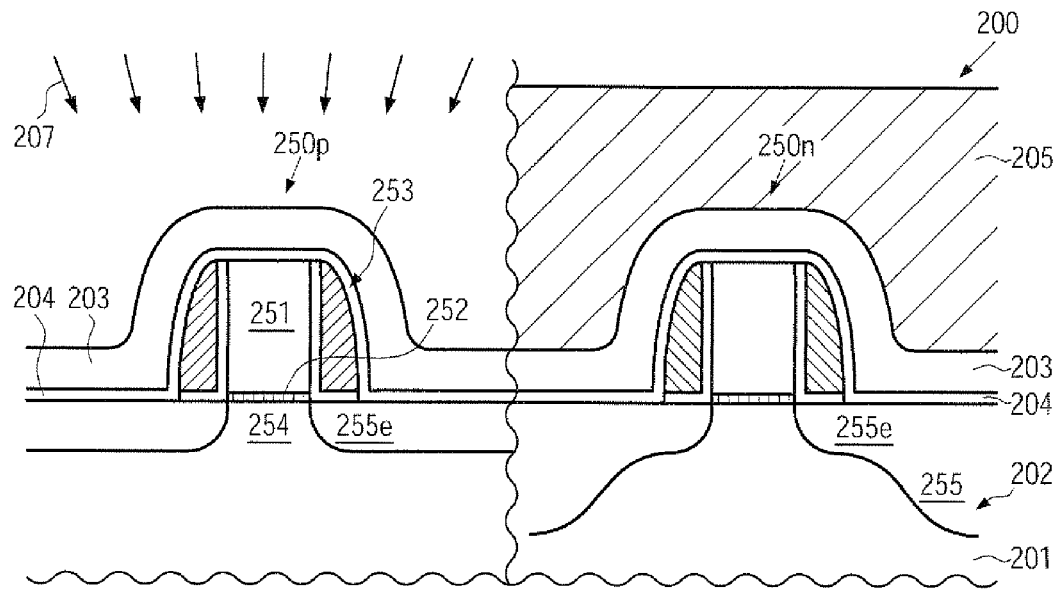
FIGS. 2a-2d schematically illustrates cross-sectional views of a semiconductor device during various manufacturing stages in which a stress memorization technique is selectively applied to an N-channel transistor without adding additional photolithography steps, according to illustrative embodiments.

FIG. 2a schematically illustrates a cross-sectional view of a semiconductor device 200 comprising a substrate 201 having formed thereabove a silicon-based semiconductor layer 202. Furthermore, a first transistor 250p and a second transistor 250n may be formed in and above the silicon-based semiconductor layer 202. It should be appreciated that the silicon-based semiconductor layer 202 is to be understood as a semiconductor material comprising a significant amount of silicon, while other components, such as germanium, carbon, tin and the like, may also be provided, at least in certain portions of the semiconductor layer 202. Furthermore, the substrate 201 and the semiconductor layer 202 may represent a bulk configuration or an SOI configuration, as previously explained with reference to the device 100, while, in other cases, areas having a bulk configuration and areas having an SOI configuration may be concurrently present in the device 200. In the embodiment shown, the first transistor 250p may represent a P-channel transistor while the transistor 250n may represent an N-channel transistor, wherein the semiconductor layer 202 may have a configuration that is appropriate for enhancing the characteristics of the transistor 250n when creating a tensile strain therein, while a respective tensile strain may not be desirable in the transistor 250p. For example, for a standard crystallographic orientation, i.e., a surface orientation (100) with the transistor length direction, i.e., in FIG. 2a, the horizontal direction, oriented along a <110> crystallographic axis or an equivalent direction, a tensile strain along the length direction may increase performance of N-channel transistors while decreasing performance of a P-channel transistor. It should be appreciated, however, that the selective stress memorization techniques disclosed herein may be applied to any crystallographic orientation in which a tensile strain may enhance performance of one type of transistor while a respective tensile strain may not be desirable in other types of transistor elements.

Moreover, in the manufacturing stage shown in FIG. 2a, the transistors 250p, 250n may comprise a gate electrode 251, in combination with a gate insulation layer 252, which separates the gate electrode 251 from a channel region 254. Moreover, a spacer structure 253 may be provided on sidewalls of the gate electrode 251. With respect to these components, the same criteria apply as previously explained with reference to the semiconductor device 100. Furthermore, the transistor 250n may comprise drain and source regions 255 and extension regions 255e, wherein at least the drain and source regions 255 are in a non-crystalline state, that is, the crystallographic structure may be in a substantially amorphous state or may at least exhibit heavy lattice damage as may be obtained by ion implantation of N-type dopant species so as to obtain a high dopant concentration of approximately $10^{20}$-$10^{22}$ dopant atoms per cubic centimeter. On the other hand, the transistor 250p may have formed therein the extension regions 255e with appropriate dopant concentration, while the deep drain and source regions 255 are still to be formed. Furthermore, a cap layer 203, for instance comprised of silicon nitride, silicon oxynitride, silicon carbide and the like, may be formed above the transistors 250p, 250n wherein, in the embodiment shown, an etch stop layer 204 may also be formed, for instance comprised of silicon dioxide or any other appropriate material having a desired high etch selectivity with respect to the cap layer 203 during an etch process 207 on the basis of an etch chemistry for removing material of the cap layer 203. Additionally, a mask 205 is provided to expose the portion of the cap layer 203 above the transistor 250p, while covering the portion of the cap layer 203 provided above the transistor 250n. In one illustrative embodiment, the mask 205 may be comprised of a resist material.

The semiconductor device 200 as shown in FIG. 2a may be formed on the basis of the following processes. After defining appropriate active regions for the transistors 250p, 250n on the basis of processes for forming isolation structures (not shown) and establishing a desired vertical dopant profile based on conventional and well-established process techniques, the gate electrodes 251 and the gate insulation layers 252 may be formed, as is also previously described with reference to the device 100. Thereafter, the extension regions 255e may be formed by appropriately masking one of the transistors 250p, 250n and introducing an appropriate doping species into the non-covered transistor. Thereafter, the mask is removed and a further mask is formed by photolithography and the extension region 255e is formed in the other transistor element. Next, the sidewall spacers 253 may be formed on the basis of well-established process techniques as also previously described, and the transistor 250p may be masked by a resist mask and the like while exposing the transistor 250n in order to implant the required dopant species, in the embodiment shown an N-type dopant species, thereby forming the drain and source regions 255. It should be appreciated that, in some illustrative embodiments, at least in the transistor 250n, a pre-amorphization implantation may have been performed prior to or after forming the drain and source regions 255, while, in other cases, the implantation of the N-type dopant species may exhibit a "self-amorphizing" effect, thereby providing the drain and source regions 255 in a non-crystalline state. In some illustrative embodiments, the extension regions 255e may still be in a substantially non-crystalline state. Next, the etch stop layer 204, if provided, may be formed, for instance by chemical vapor deposition (CVD) techniques, followed by the deposition of the cap layer 203. For example, the cap layer 203 may be formed with an appropriate thickness in accordance with device requirements, for instance with a thickness in the range of approximately 20-100 nm. Thereafter, the mask 205 may be formed by, for instance, depositing a resist material and patterning the same on the basis of well-established photolithography techniques. Subsequently, the device 200 may be exposed to the etch ambient 207, for instance in the form of a wet chemical ambient or a plasma assisted ambient, in order to selectively remove material of the cap layer 203 with respect to the etch stop layer 204. For instance, highly selective etch recipes for silicon nitride, silicon carbide, silicon oxynitride with respect to silicon dioxide are available and may be used for this purpose.

Figure 2B:
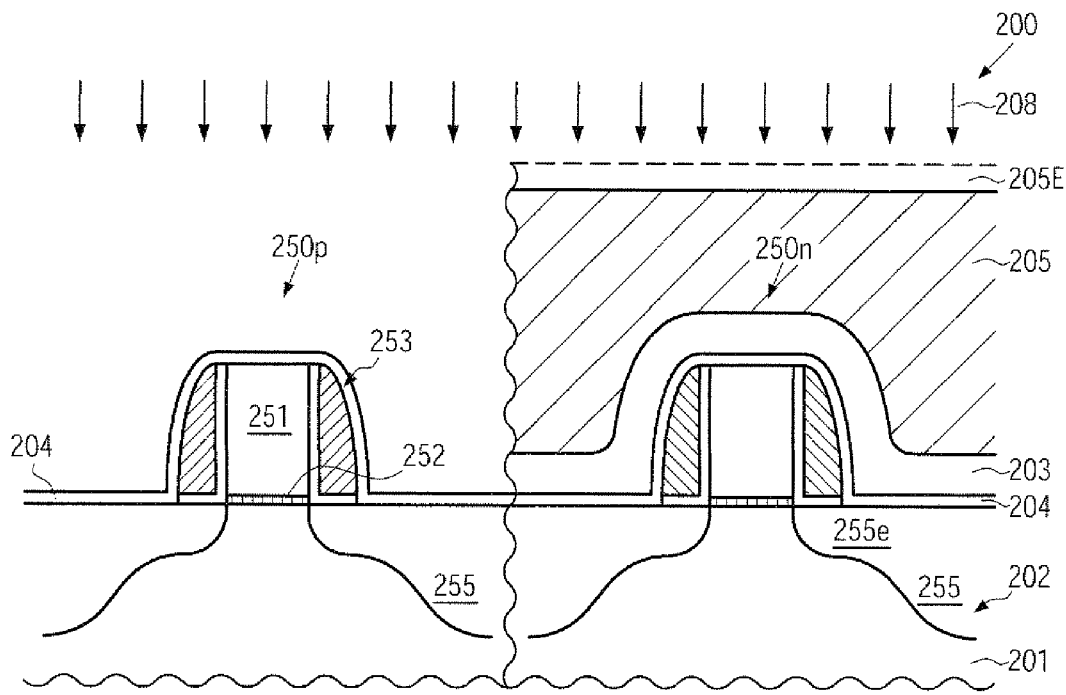

FIG. 2b schematically illustrates the semiconductor device 200 after the patterning of the cap layer 203, wherein the device 200 is exposed to an ion implantation process 208 that is designed to form the drain and source regions 255 in the transistor 250p. During the ion implantation process 208, the mask 205 may act as an implantation mask in combination with the cap layer 203 wherein, if required, a respective erosion of the mask 205 during the etch process 207, as indicated by 205e, may be taken into consideration by appropriately providing the mask 205 with an extra height if the blocking effect of the mask 205 after the erosion 205e may be considered inappropriate on the basis of a resist thickness as may usually be used for an ion implantation process for forming the drain and source regions 255 in the transistor 250p. In other cases, the material loss or erosion 205e may be compensated for or even over-compensated for by the presence of the cap layer 203, which may have an increased blocking capability compared to the material of the mask 205.

Figure 2C:
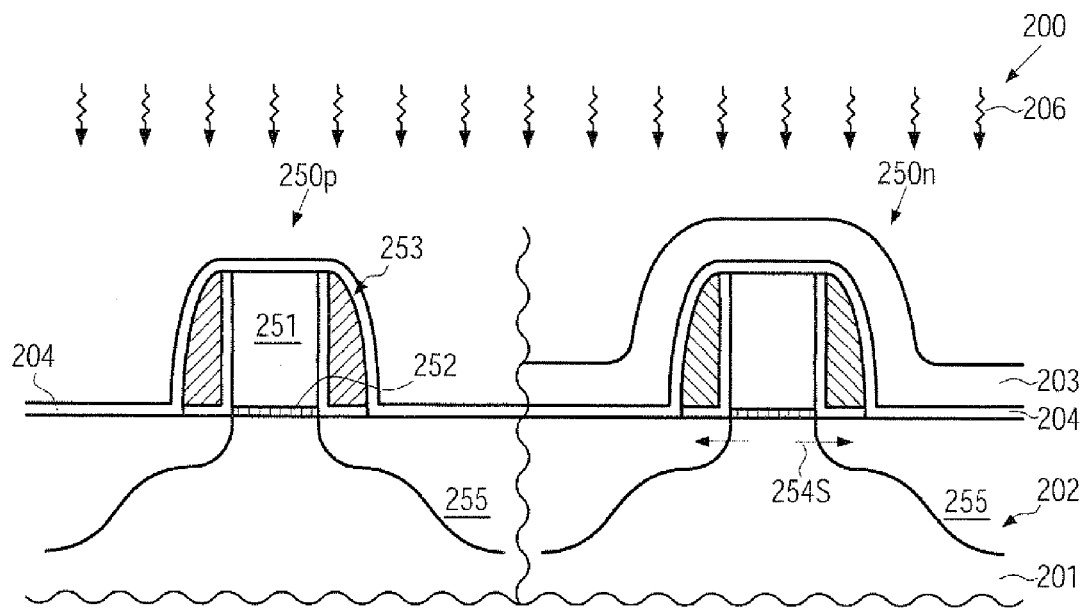

FIG. 2c schematically illustrates the semiconductor device 200 after the removal of the mask 205 and during an anneal process 206 that is performed in the presence of the remaining portion of the cap layer 203. The anneal process 206 may be performed on the basis of process parameters established for conventional techniques, as previously described. The anneal process 206 may comprise rapid thermal anneal techniques and/or laser-based or flashlight-based anneal processes in which the overall exposure time may be moderately short, such as 0.1 seconds and less, thereby substantially avoiding significant dopant diffusion. In other cases, reduced energy levels and thus anneal temperatures may be used so as to provide a certain degree of dopant diffusion, as required for adjusting the effective channel length in accordance with device requirements. As previously explained, during the anneal process 206, dopant atoms may be activated, i.e., positioned at lattice sites, and the non-crystalline state of substantially amorphized or heavily damaged portions of the semi-conductor layer 202 may also be re-crystallized. Due to the presence of the cap layer 203, a respective tensile strain 254S may be obtained in the transistor 250n.

Figure 2D:
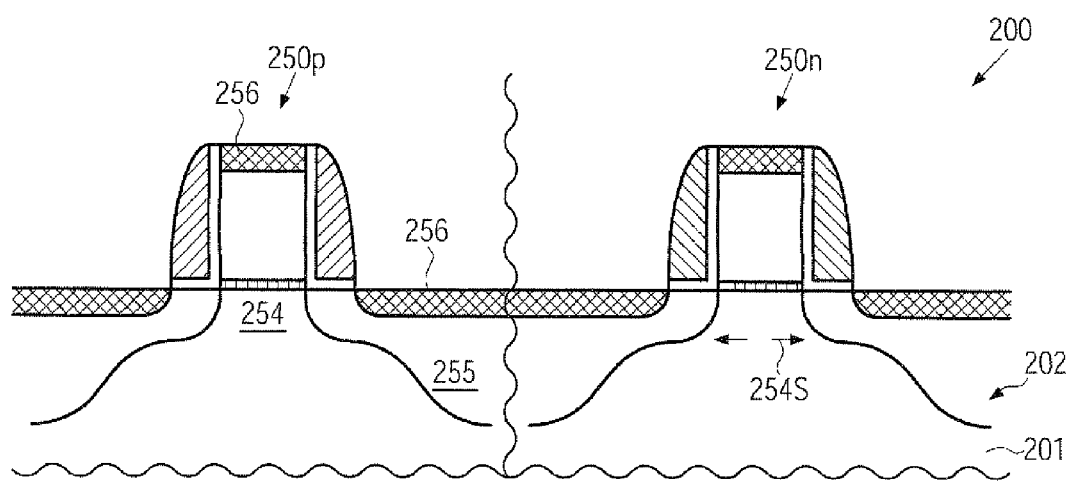

FIG. 2*d* schematically illustrates the semiconductor device 200 in a further advanced manufacturing stage. As shown, the cap layer 203 and the etch stop layer 204 are removed and metal silicide regions 256 are provided in the transistors 250*p*, 250*n*. The removal of the cap layer 203 and the etch stop layer 204 may be accomplished on the basis of appropriate etch techniques for the respective materials, as are, for instance, also described with reference to the device 100. Similarly, the metal silicide regions 256 may be formed on the basis of well-established techniques, for instance, by depositing a refractory metal, initiating a chemical reaction between the silicon material in the layer 202 and the gate electrode 251 and removing non-reacted material, possibly in combination with appropriately designed anneal steps.

Consequently the desired strain 254S may be selectively provided in the transistor 250*n* without adding an additional photolithography step, since the mask 205 may be used as an etch mask for patterning the cap layer 203 and as an implantation mask for defining the drain and source regions 255 in the transistor 250*p* so that the corresponding photolithography process for forming the mask 205 may have been necessary at any rate so as to define the drain and source regions of the transistors 250*p*, 250*n*.

With reference to FIGS. 3*a*-3*e*, further illustrative embodiments will now be described, in which a selective application of a stress memorization technique may be accomplished by "patterning" the crystalline state prior to forming the drain and source regions of one type of transistor and prior to providing a respective cap layer for re-crystallizing non-crystalline areas in a highly strained state.

Figure 3A:
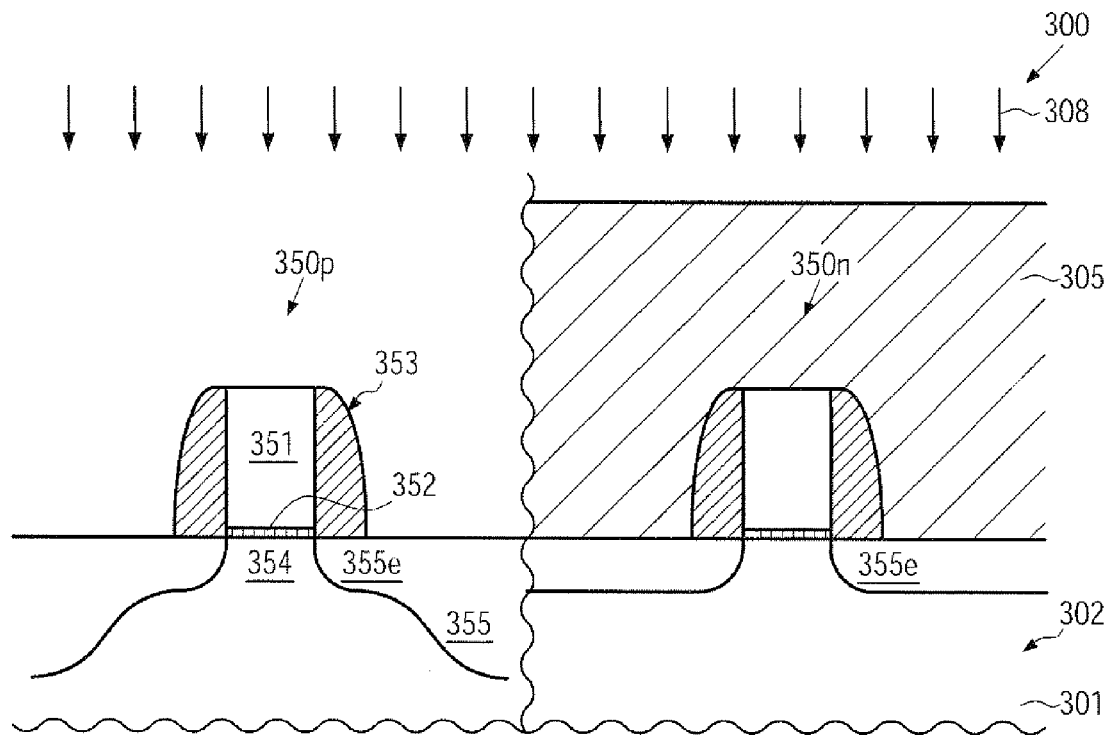
FIGS. 3a-3d schematically illustrate cross-sectional views of a semiconductor device during various manufacturing stages in which a stress memorization technique is selectively applied by modifying the crystalline state of the P-channel transistor prior to forming a cap layer, according to illustrative embodiments.

FIG. 3*a* schematically illustrates a semiconductor device 300 comprising a first transistor 350*p* and a second transistor 350*n*, wherein a strain is to be selectively created in the transistor 350*n* on the basis of a selective stress memorization technique. The transistors 350*p*, 350*n* may represent any transistors of the same or different conductivity type in which a tensile strain may be advantageous in the transistor 350*n*, while a respective tensile strain may not be desired in the transistor 350*p*. For example, the transistor 350*p* may be a P-channel transistor while the transistor 350*n* may represent an N-channel transistor. Moreover, the transistors 350*p*, 350*n* may have a similar configuration as is also explained with reference to the devices 100 and 200 and, therefore, respective components may be referred to by the same reference numerals except for the first digit "3" instead of a "1" or "2." Thus, in the manufacturing stage shown, the transistors 350*p*, 350*n* may comprise a gate electrode structure 351, a gate insulation layer 352 and a spacer structure 353. Moreover, extension regions 355*e* are provided in the transistors 350*p*, 350*n* and an implantation mask 305 covers the transistor 350*n* while exposing the transistor 350*p* to an implantation process 308 designed to form drain and source regions 355 in the transistor 350*p*.

With respect to any manufacturing techniques for forming the device 300, similar criteria may apply as previously explained with reference to the devices 100 and 200.

Figure 3B:
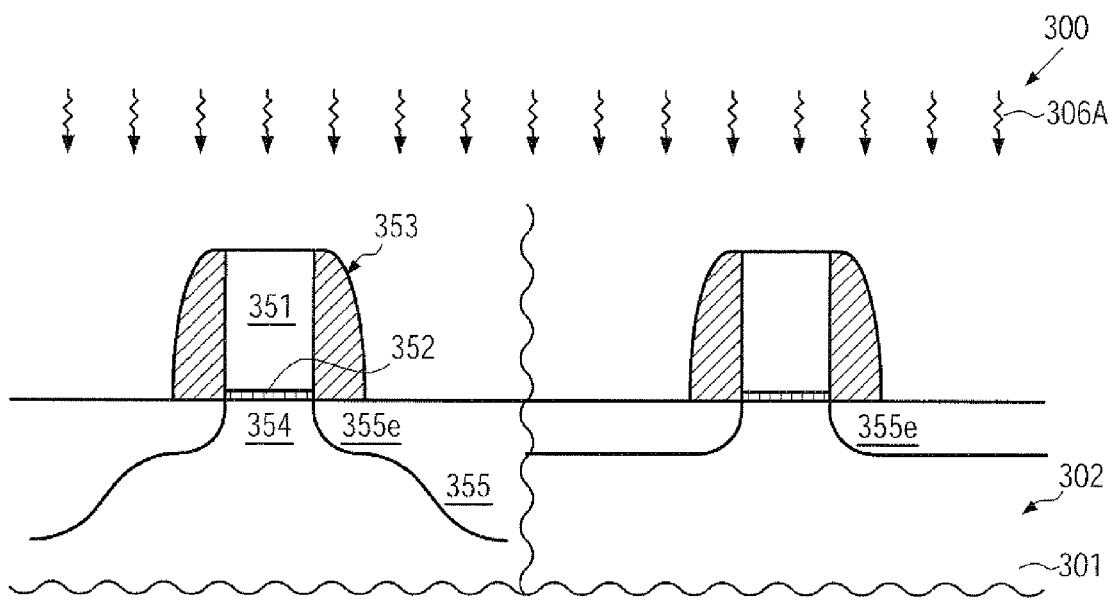

FIG. 3*b* schematically illustrates the device 300 in a further advanced manufacturing stage after the removal of the mask 305 and during a first anneal process 306A, which may be performed on the basis of appropriate process parameters so as to obtain a substantially crystalline state in the drain and source regions 355 and the extension regions 355*e* of the transistor 350*p*. It should be appreciated that a substantially crystalline state may also be obtained in the extension regions 355*e* of the transistor 350*n*. For example, the anneal process 306A may be performed on the basis of moderately low temperatures in the range of approximately 500-800° C., thereby maintaining dopant diffusion at a moderately low level while nevertheless providing an efficient re-crystallization of damaged crystalline portions of the semiconductor layer 302. In other cases, advanced laser-based or flashlight-based anneal techniques may be used so as to re-crystallize the damaged portion without a significant diffusion activity. In still other illustrative embodiments, the process parameters, i.e., temperature and duration during the process 306A, may be selected such that a desired degree of dopant diffusion may be obtained in order to appropriately adjust the effective channel length for at least a first step if a subsequently performed anneal process for creating the desired strain in the transistor 350*n* may also be designed to create a specific amount of diffusion activity.

Figure 3C:
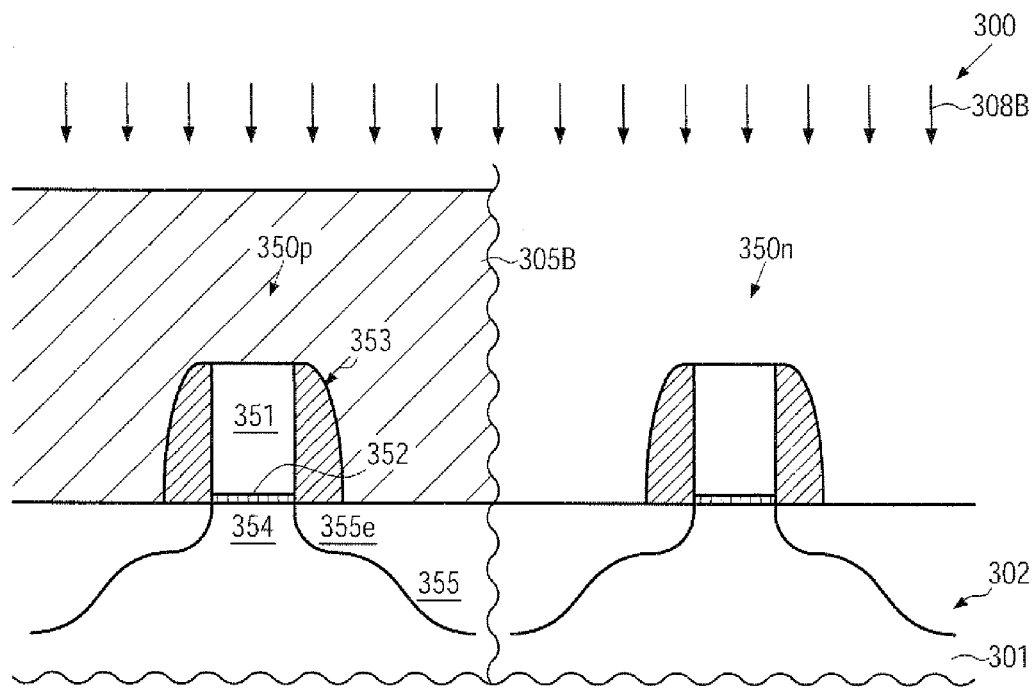

FIG. 3*c* schematically illustrates the device 300 in a further advanced manufacturing stage. As shown, a further implantation mask 305B may be provided so as to cover the transistor 350*p* while exposing the transistor 350*n* to a further implantation process 308B designed to introduce an implantation species for creating a non-crystalline state. In one illustrative embodiment, the implantation process 308B may comprise an amorphization implantation, for instance on the basis of an appropriate species such as xenon and the like, followed by the deposition of an appropriate species for forming the drain and source regions 355 of the transistor 350*n*. In other illustrative embodiments, the implantation process 308B may be performed on the basis of an N-type species which may exhibit a substantially self-amorphizing effect during penetration of exposed portions of the layer 302, thereby creating a substantially amorphous state of the drain and source regions 355.

Figure 3D:
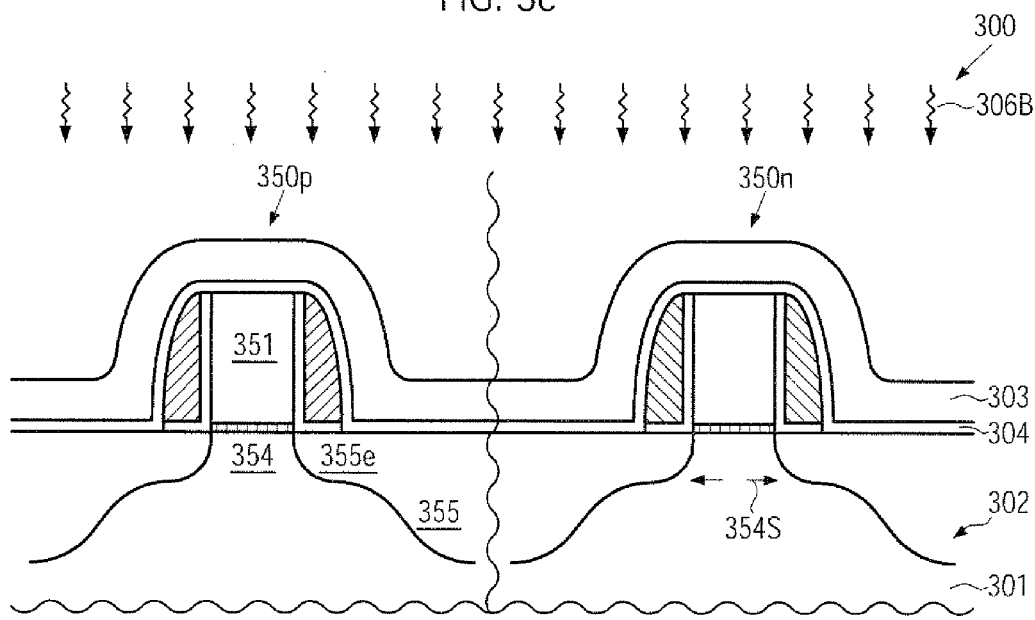

FIG. 3*d* schematically illustrates the device 300 after the removal of the mask 305B and with a cap layer 303 formed above the transistors 350*p*, 350*n*. Furthermore, an etch stop layer 304 may be provided, as is also previously explained when referring to the layers 103, 104 and 203, 204. Furthermore, the device 300 may be subjected to a further anneal process 306B that is designed to re-crystallize the non-crystalline state of the drain and source regions 355 in the transistor 350*n* and also activate the dopant species therein. In one illustrative embodiment, the anneal process 306B may be performed on the basis of similar process parameters as in conventional selective stress memorization techniques when the previously performed anneal process 306A (FIG. 3*b*) may have been performed so as to suppress undue dopant diffusion in the transistor 350*p*. Hence, the overall dopant diffusion in the transistors 350*p*, 350*n* may be substantially adjusted on the basis of the anneal process 306B, wherein, additionally, an enhanced degree of dopant activation may be achieved in the transistor 350*p* due to the preceding anneal process 306A. At the same time, the desired strain 354S may be created in the transistor 350*n* due to the presence of the cap layer 303, while the drain and source regions 355 of the transistor 350*p* are already in a substantially crystalline state and may therefore remain in a substantially strain-neutral state. In other illustrative embodiments, the anneal process 306B may be performed on the basis of appropriate process parameters so as to contain dopant diffusion at a low level when a respective diffusion activity may have been initiated during the process 306A. Also, a desired combination of diffusion activity in the anneal processes 306A, 306B may be used, if desired. Thus, a high degree of flexibility in adjusting the effective channel length for the transistors 350*p*, 350*n* may be provided, while not unduly contributing to the overall process complexity. Consequently, also in this case, a desired strain 354S may be created on the basis of a process flow requiring a reduced number of photolithography steps compared to the conventional strategy as described with reference to FIGS. 1a-1d.

With reference to FIGS. 4a-4f, further illustrative embodiments will now be described in which a functional material layer, such as a spacer layer, may be used as a cap layer for a selective stress memorization technique in order to avoid additional photolithography steps.

Figure 4A:
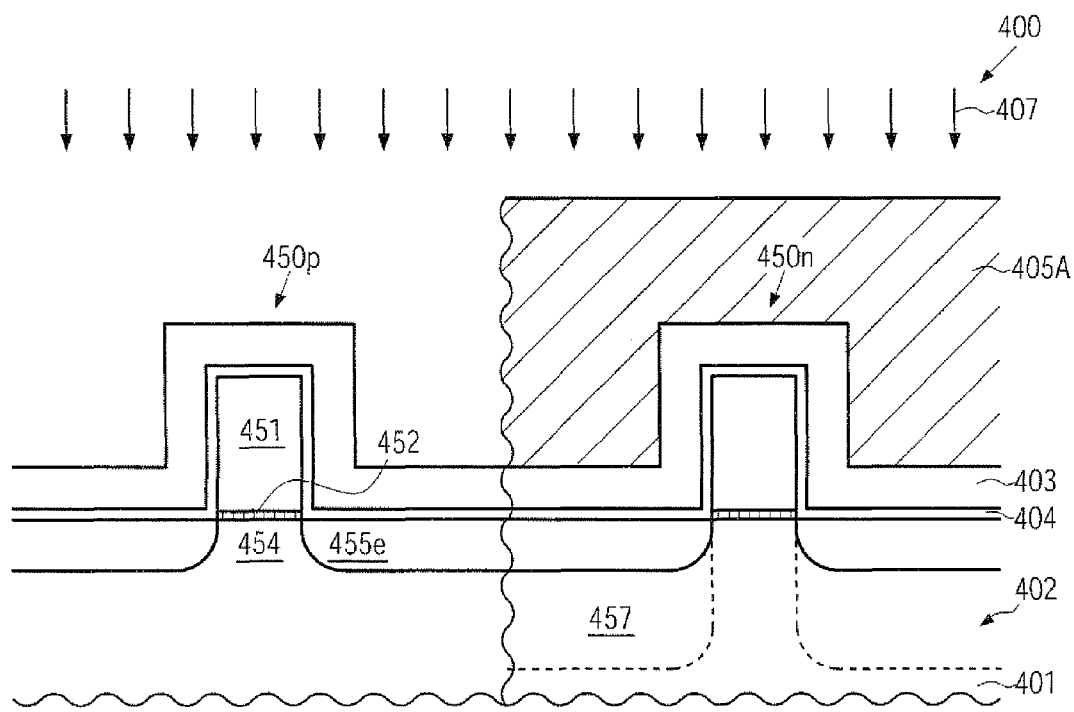
FIGS. 4a-4f schematically illustrate cross-sectional views of a semiconductor device during various manufacturing stages in which a stress memorization technique is selectively applied on the basis of a spacer layer, according to illustrative embodiments.

FIG. 4a schematically illustrates a semiconductor device 400 comprising a substrate 401 and a silicon-based semiconductor layer 402. Furthermore, a first transistor 450p and a second transistor 450n may be provided and may comprise a gate electrode 451, a gate insulation layer 452 and extension regions 455e enclosing respective channel regions 454. For the components described so far, the same criteria apply as previously explained for the devices 100, 200 and 300. Hence, a detailed description of these components may be omitted here. Moreover, at least the transistor 450n, in which a desired type of strain is to be created, may comprise, in one illustrative embodiment, substantially amorphized portions 457 in the semiconductor layer 402. In the manufacturing stage shown, the semiconductor device 400 may further comprise an etch stop layer 404, for instance comprised of silicon dioxide, followed by a spacer layer 403, which may also act as a cap layer for the selective stress memorization technique. The spacer layer 403 may be provided with an appropriate thickness so as to obtain appropriately designed sidewall spacer structures in the transistor 450p.

The semiconductor device 400 as shown in FIG. 4a may be formed on the basis of process techniques as are also previously described, that is, after forming the gate electrode structures 451 and forming optional offset spacers (not shown), the extension regions 455e may be formed on the basis of a respective masking and implantation regime, as previously explained, wherein, at least in the transistor 450n, the substantially amorphized portions 457 may also be created by ion implantation. Thereafter, the etch stop layer 404 may be deposited, for instance, by plasma enhanced chemical vapor deposition (PECVD), followed by the deposition of the spacer layer 403, for instance, by performing PECVD techniques for depositing a silicon nitride material with a desired thickness. Thereafter, a mask 405A, such as a resist mask, may be formed by photolithography and thereafter an anisotropic etch process 407 may be performed in order to selectively remove material of the spacer layer 403. For this purpose, well-established process recipes may be used.

Figure 4B:
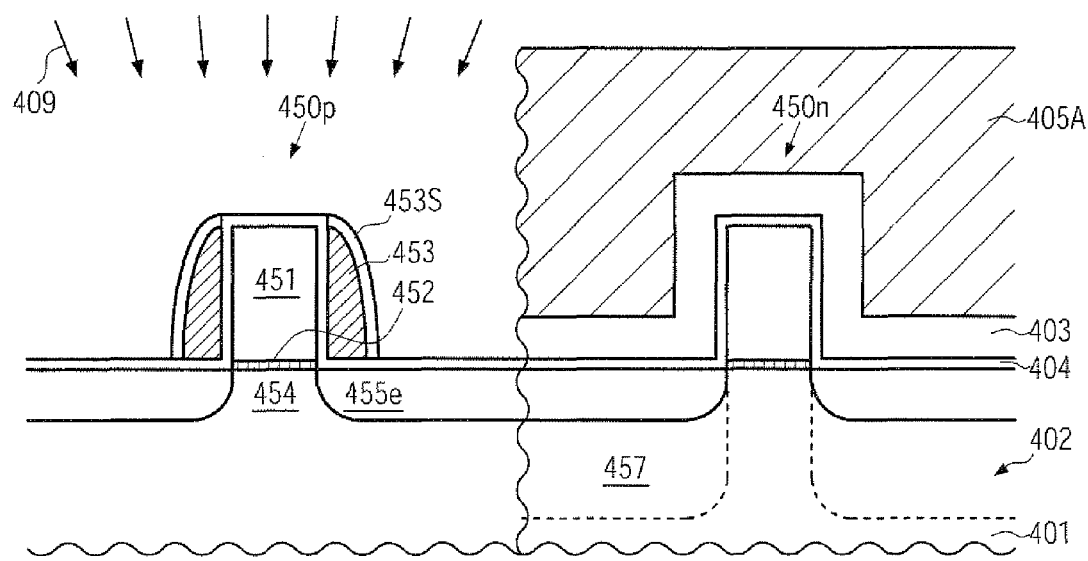

FIG. 4b schematically illustrates the device 400 after the etch process 407, thereby creating a respective spacer structure 453 having a width as required for defining a lateral dopant profile in the transistor 450p. Furthermore, the device 400 may be subjected to a surface modification process 409 in order to modify a surface portion 453S of the spacer structure 453. For example, the treatment 409 may comprise a plasma treatment on the basis of oxygen, thereby forming a silicon dioxide-like material in the surface portions 453S, thereby significantly altering the etch behavior of the spacer structure 453. To this end, the treatment 409 may be performed on the basis of process temperatures that may not unduly affect the mask 405A. For instance, temperatures in the range of 100-250° C. may be used. In other illustrative embodiments, the treatment 409 may comprise a deposition of an appropriate material, such as silicon dioxide, at moderately low temperatures so as to not unduly affect the mechanical integrity of the mask 405A.

Figure 4C:
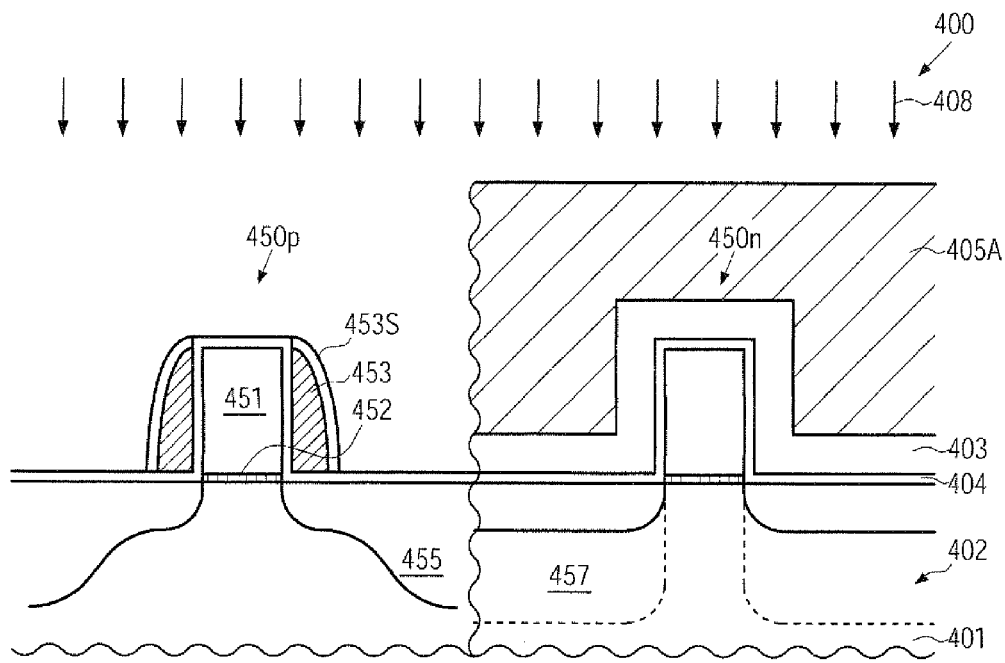

FIG. 4c schematically illustrates the device 400 during an ion implantation process 408 designed to create drain and source regions 455 in the transistor 450p. At the same time, the mask 405A, in combination with the spacer layer 403, may act as an implantation mask.

Figure 4D:
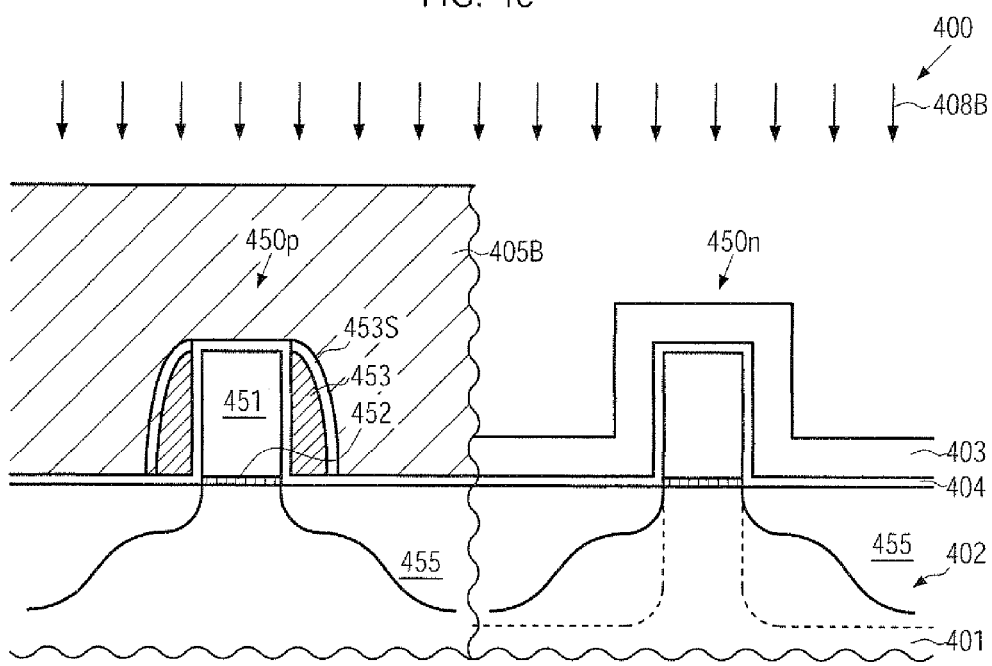

FIG. 4d schematically illustrates the device 400 after the removal of the mask 405A and with a further implantation mask 405B covering the transistor 450p while exposing the transistor 450n, i.e., the remaining portion of the spacer layer 403. Furthermore, the device 400 is subjected to a further ion implantation process 408B designed to create drain and source regions 455 in the transistor 450n. During the implantation process 408B, the respective process parameters, i.e., the implantation energy, may be appropriately selected so as to obtain an increased penetration depth, thereby taking into account the presence of the layer 403. It should be appreciated that, due to the presence of the substantially amorphized portions 457, the ion implantation process 408B may not substantially modify the overall crystalline state. That is, a substantially "high volume" state of the material of the portion 457 may have been created prior to the deposition of the spacer layer 403 and may not be substantially modified during the implantation 408B. Furthermore, typically, the molecular structure of the layer 403 may be affected by the ion bombardment 408B and in particular a reconfiguration during a subsequent anneal process may be significantly less pronounced in the layer 403 compared to the drain and source regions 455.

Figure 4E:
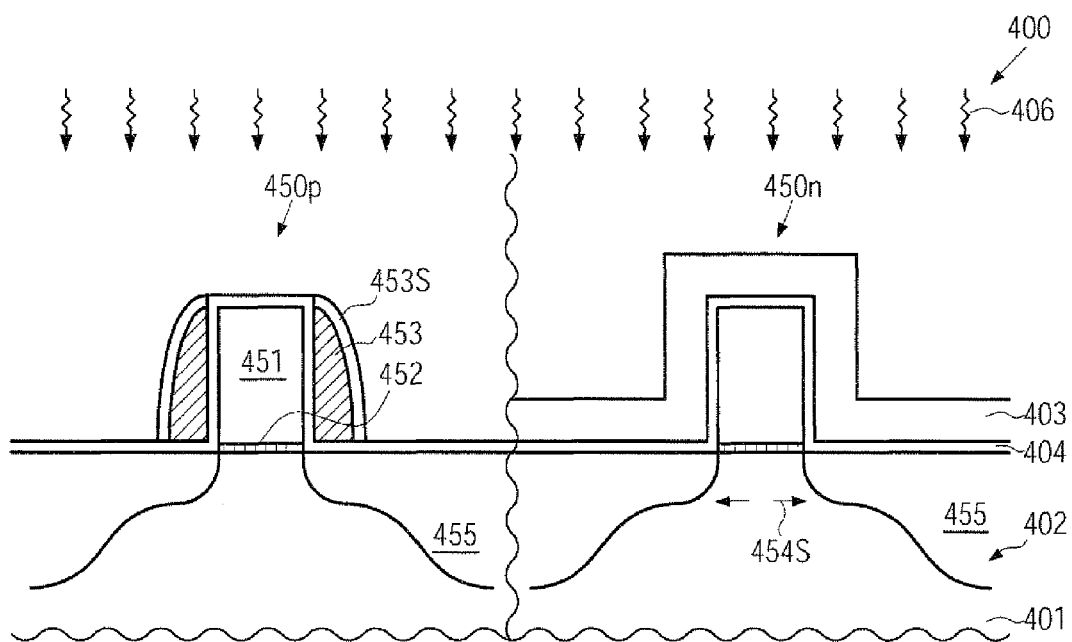

FIG. 4e schematically illustrates the device 400 after the removal of the mask 405B and during an anneal process 406 that is performed in the presence of the layer 403 so as to activate the dopant species and also re-crystallize damaged or substantially amorphous portions of the semiconductor layer 402. Hence, upon re-crystallizing the structure in the transistor 450n, a desired tensile strain 454S may be created, as also previously explained.

Figure 4F:
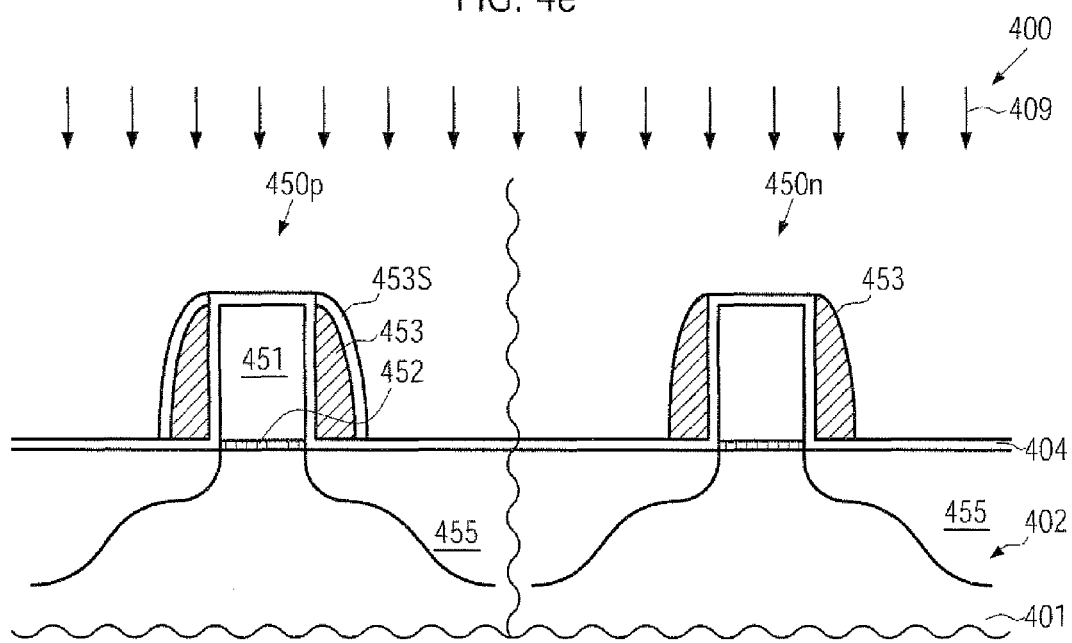

FIG. 4f schematically illustrates the device 400 during a select etch process 409 that is designed to move material of the layer 403 in order to form respective spacers 453 in the transistor 450n. For this purpose, highly selective plasma assisted etch recipes may be used wherein the etch stop layer 404 and the surface portions 453S may be used as etch stop materials, thereby substantially maintaining the spacer structure 453 in the transistor 450p. Thereafter, the etch stop layer 404 may be removed on the basis of well-established process techniques, for instance wet chemical etch recipes, wherein the portion 453S may also be removed if comprised of a similar material as the etch stop layer 404. Hence, the device 400 may be prepared for receiving metal silicide regions which may be formed in a self-aligned manner due to the provision of the spacer structures 453 in both transistors 450p, 450n. Hence, the further processing may be continued on the basis of well-established process techniques. Thus, also in this case, the strain 454S may be obtained in a selective manner without requiring additional photolithography steps compared to the conventional strategy.

Figure 5A:
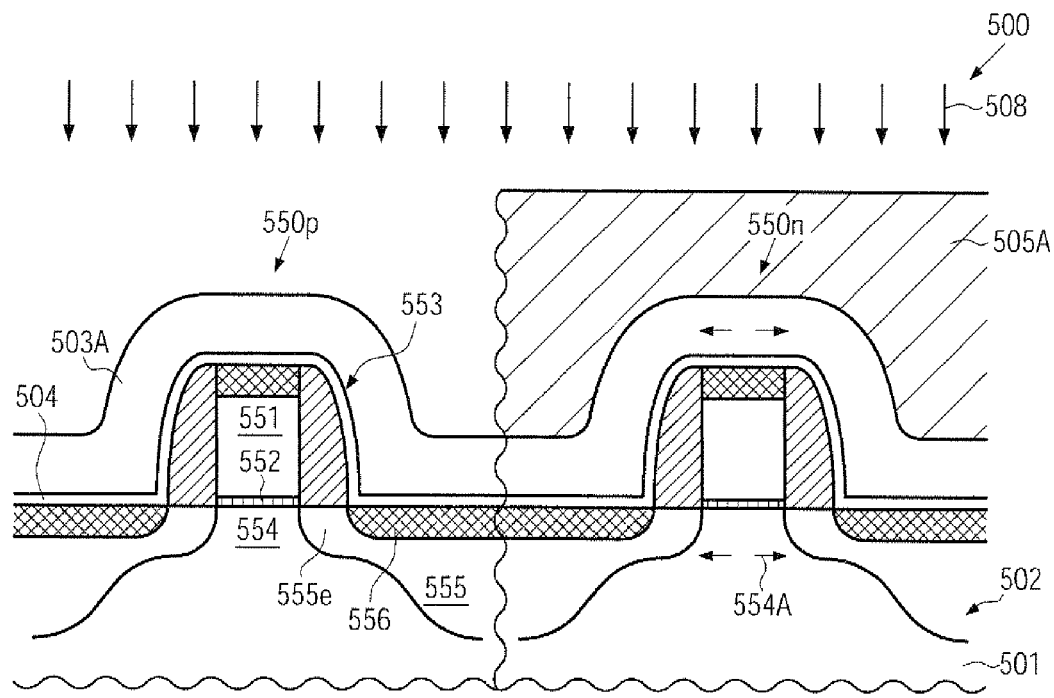
FIGS. 5a-5c schematically illustrate cross-sectional views of a semiconductor device during various stages in selectively applying a stress memorization technique without adding additional lithography steps on the basis of a stressed contact etch stop layer, according to still further illustrative embodiments.
Figure 5B:
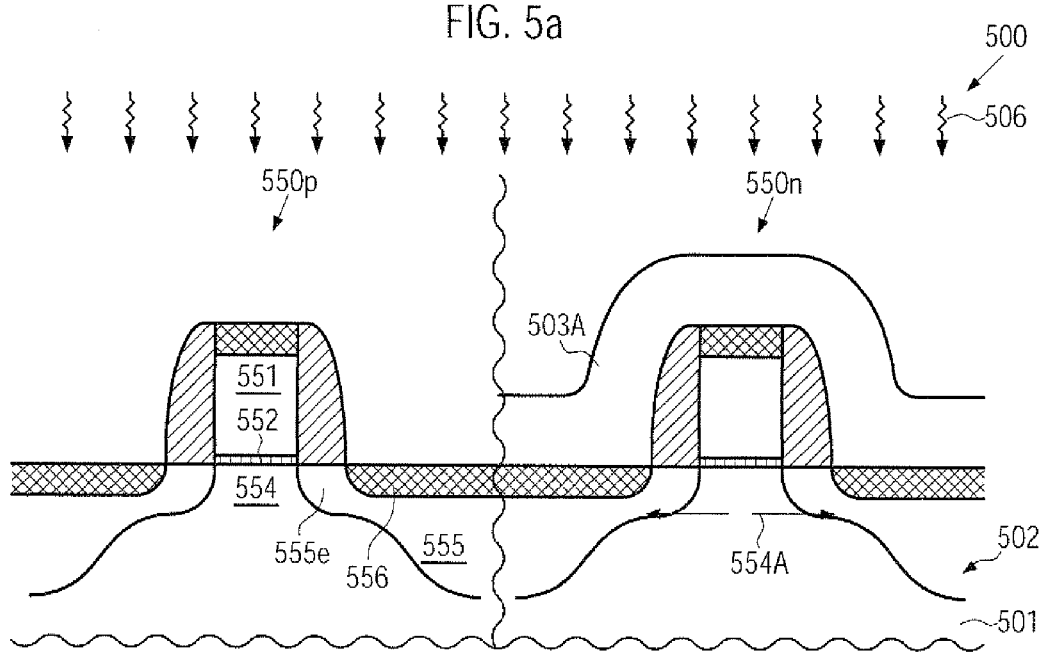
Figure 5C:
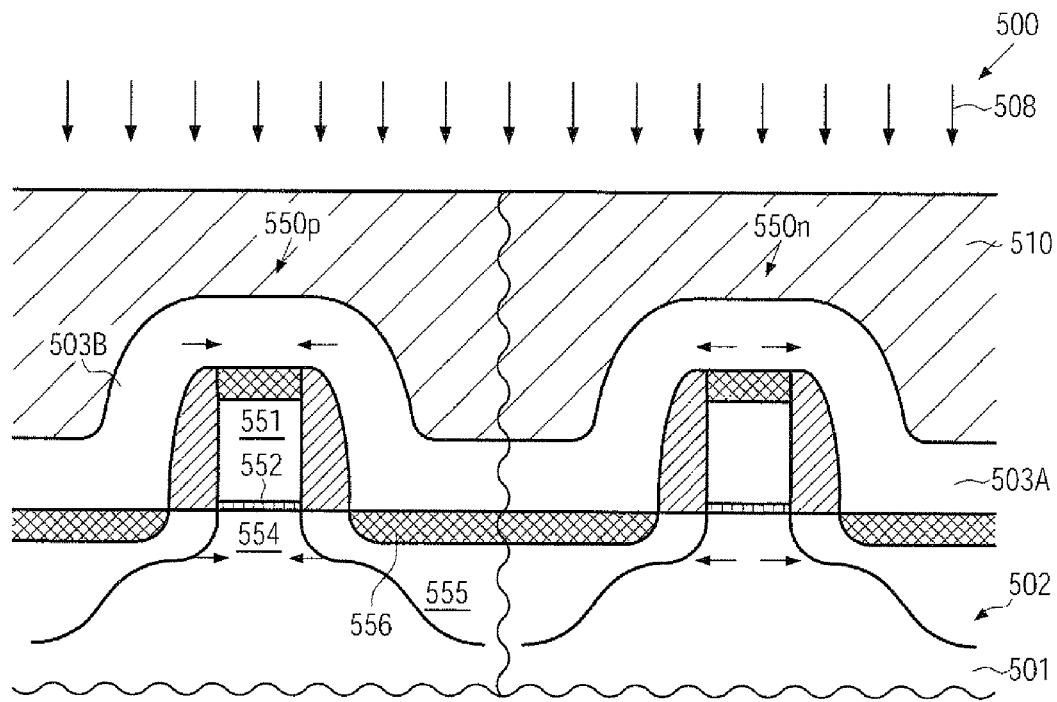

With reference to FIGS. 5a-5c, further illustrative embodiments will now be described in which a functional layer, such as a highly stressed contact etch stop layer, may be used for applying a selective stress memorization technique.

FIG. 5a schematically illustrates a cross-sectional view of a semiconductor device 500 comprising a first transistor 550p and a second transistor 550n. The transistors 550p, 550n may be formed on the basis of the substrate 501 and a silicon-based semiconductor layer 502. Moreover, the transistors 550p, 550n may comprise a gate electrode structure 551, a gate insulation layer 552 and a spacer structure 553. In some illustrative embodiments, the spacer structure 553 may be removed in this manufacturing stage. For these components, the same criteria may apply as previously explained with reference to the devices 100, 200, 300, 400. Similarly, the transistors 550*p*, 550*n* may comprise drain and source regions 555, in combination with extension regions 555*e*, wherein at least the drain and source regions 555 of the transistor 550*n* may be in a non-crystalline state. Additionally, metal silicide regions 556 may be provided, and both transistors 550*p*, 550*n* may be covered by a highly stressed dielectric layer 503A, possibly in combination with an optional etch stop layer 504. The highly stressed dielectric layer 503A may be provided in the form of a tensile-stressed silicon nitride material with a thickness of approximately 30-100 nm in sophisticated applications. For example, silicon nitride material may be provided with high internal stress, wherein a tensile stress level may range up to approximately 1.5 GPa or even higher. Furthermore, in the manufacturing stage shown, a mask 505A may be provided so as to expose a portion of the layer 503A positioned above the transistor 550*p*.

The semiconductor device 500 as shown in FIG. 5*a* may be formed on the basis of the following process techniques. After creating the basic transistor configuration by well-established techniques, that is, forming the gate electrodes 551 and the spacer structures 553, in combination with respective implantation sequences for defining the extension regions 555*e* and the drain and source regions 555, in some illustrative embodiments, the drain and source regions 555 and the extensions 555*e* of both transistors 550*p*, 550*n* may be maintained in a highly damaged or substantially amorphous state, while, in other illustrative embodiments, at least the drain and source regions 555 of the transistor 550*n* may be maintained in a non-crystalline state. Thereafter, the metal silicide regions 556 may be formed by, for instance, depositing a refractory metal and initiating a chemical reaction between the metal and the silicon material in the drain and source regions 555 and the gate electrodes 551. A chemical reaction may be initiated on the basis of moderately low temperatures in the range of approximately 250-400° C., wherein the substantially amorphous state may provide enhanced process uniformity due to the highly uniform diffusion behavior of the metal and the silicon material, which is in the substantially amorphous state. Due to the moderately low process temperatures, a significant re-crystallization may be avoided. Thereafter, any non-reacted metal material may be removed by selective etch techniques and thereafter the optional etch stop layer 405, if required, may be formed, for instance by plasma enhanced deposition techniques. Next, the stressed dielectric layer 403A may be formed on the basis of appropriately selected process parameters so as to obtain a desired high tensile stress level. Thereafter, the mask 505A may be formed on the basis of respective photolithography techniques, as may also be used during conventional dual stress liner approaches in which highly stressed dielectric material may be positioned above one type of transistor and may be selectively removed from above another type of transistor, followed by the deposition of a further highly stressed dielectric material of different stress characteristics, which may again be subsequently patterned on the basis of photolithography. Hence, based on the mask 505A, the exposed portion of the layer 503A may be removed on the basis of well-established selective etch recipes.

FIG. 5*b* schematically illustrates the device 500 after the removal of the mask 505A and during an anneal process 506, such as a laser-based anneal process or a flashlight-based anneal process designed to re-crystallize non-crystalline portions and also to activate a dopant species in the drain and source regions 555 and the extension regions 555*e*. Furthermore, the metal silicide regions 556 may be stabilized during the anneal process 506. Furthermore, the strain level 554A generated by the presence of the layer 503A in the transistor 550*n* may further be enhanced due to the strained re-crystallization, as previously explained, thereby efficiently combining the strain-inducing mechanism provided by the layer 503A with the stress memorization technique, as previously explained.

FIG. 5*c* schematically illustrates the device 500 in a further advanced manufacturing stage in which a stressed dielectric layer 503B is formed above the transistor 550*p*, wherein an internal stress level may be selected such that a desired type of strain, for instance a compressive strain, may be created in the channel region 554 of the transistor 550*p*. The layer 503B may be formed by depositing the layer 503B and selectively removing an unwanted portion thereof from above the transistor 550*n* by using a respective etch mask. Thereafter, an interlayer dielectric material 510 may be deposited above the layers 503B, 503A and respective contact openings may be formed to respective areas of the transistors 550*p*, 550*n*, wherein the interlayer dielectric material 510 may be patterned by using the layers 503B, 503A as etch stop materials, which may be opened in separate etch steps in accordance with well-established patterning regimes.

Consequently, the selective stress memorization technique may be efficiently combined with additional strain-inducing mechanisms, such as provided by the layers 503B, 503A, without adding additional lithography steps, since the highly stressed dielectric layer 503A may also be used as a cap layer for the strained re-crystallization process.

With reference to FIGS. 6*a*-6*g*, further illustrative embodiments will now be described in which a selective stress memorization technique may be applied several times during the entire manufacturing sequence without adding additional photolithography steps.

Figure 6A:
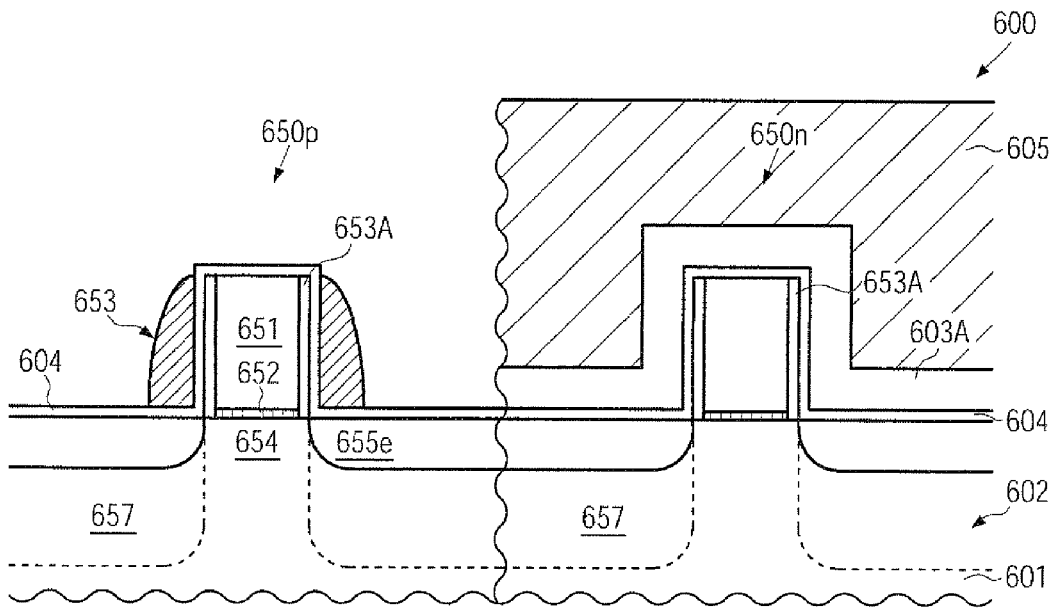
FIGS. 6a-6g schematically illustrate cross-sectional views of a semiconductor device during various manufacturing stages in which a selective stress memorization technique may be applied two or more times without adding additional photolithography steps, according to yet other illustrative embodiments.

FIG. 6*a* schematically illustrates a semiconductor device 600 comprising a substrate 601 and a semiconductor layer 602, in and above which may be formed a first transistor 650*p* and a second transistor 650*n*. The transistors 650*p*, 650*n* may comprise a gate electrode 651, a gate insulation layer 652 and respective extension regions 655*e* enclosing a channel region 654. For these components, the same criteria apply as previously explained for respective components of the devices 100, 200, 300, 400, 500. Furthermore, in the manufacturing stage shown, the transistor 650*p* may comprise an offset spacer 653A and a spacer structure 653. On the other hand, the transistor 650*n* may comprise the offset spacer 653A, if required, while a spacer structure is not yet patterned. Instead, an etch stop layer 604 and a spacer layer 603A may be formed above the transistor 650*n*. Furthermore, an etch mask 605 may cover the transistor 650*n*.

The device 600 as shown in FIG. 6*a* may be formed on the basis of similar process techniques as previously described. That is, after forming the gate electrode 651, the offset spacers 653A, if required, may be formed on the basis of well-established techniques, followed by an implantation process for defining the extension region 655*e* on the basis of well-established masking and implantation regimes, as previously explained. In some illustrative embodiments, at least in the transistor 650*n*, a substantially amorphized portion 657 may be formed on the basis of well-established implantation recipes. Thereafter, the etch stop layer 604 may be deposited, followed by the deposition of the spacer layer 603A and the formation of the mask 605. Next, an anisotropic etch process may be performed to obtain the spacer structure 653 in the transistor 650*p*, according to well-established etch recipes.

Figure 6B:
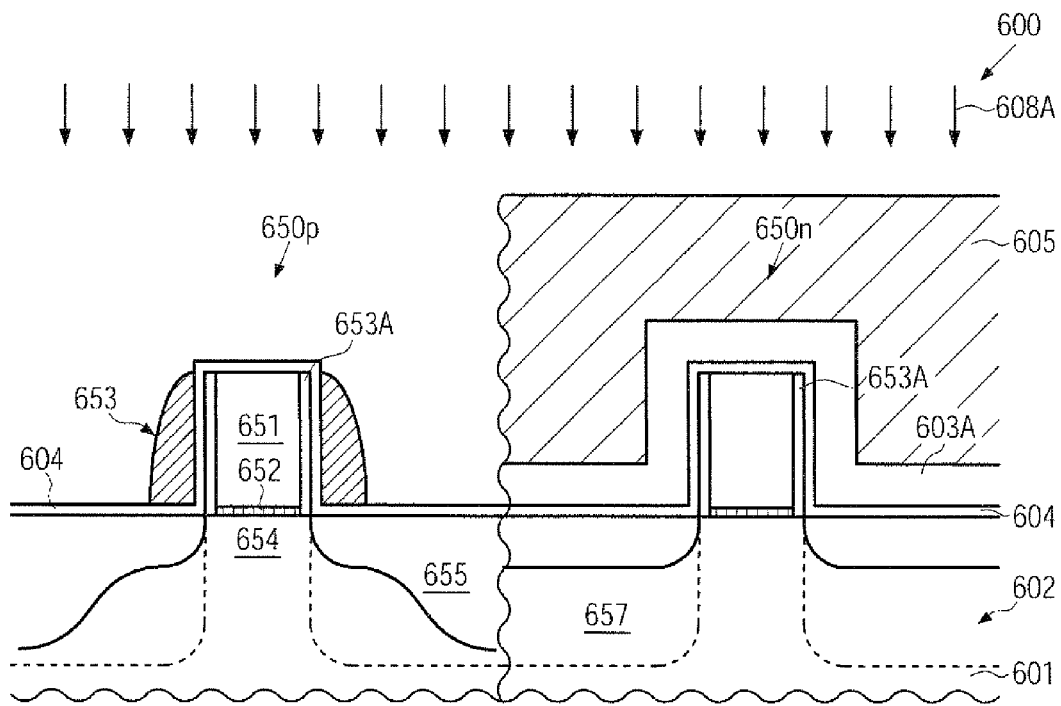

FIG. 6*b* schematically illustrates the semiconductor device 600 during an ion implantation process 608A that is performed on the basis of the mask 605, thereby creating drain and source regions 655 in the transistor 650p.

Figure 6C:
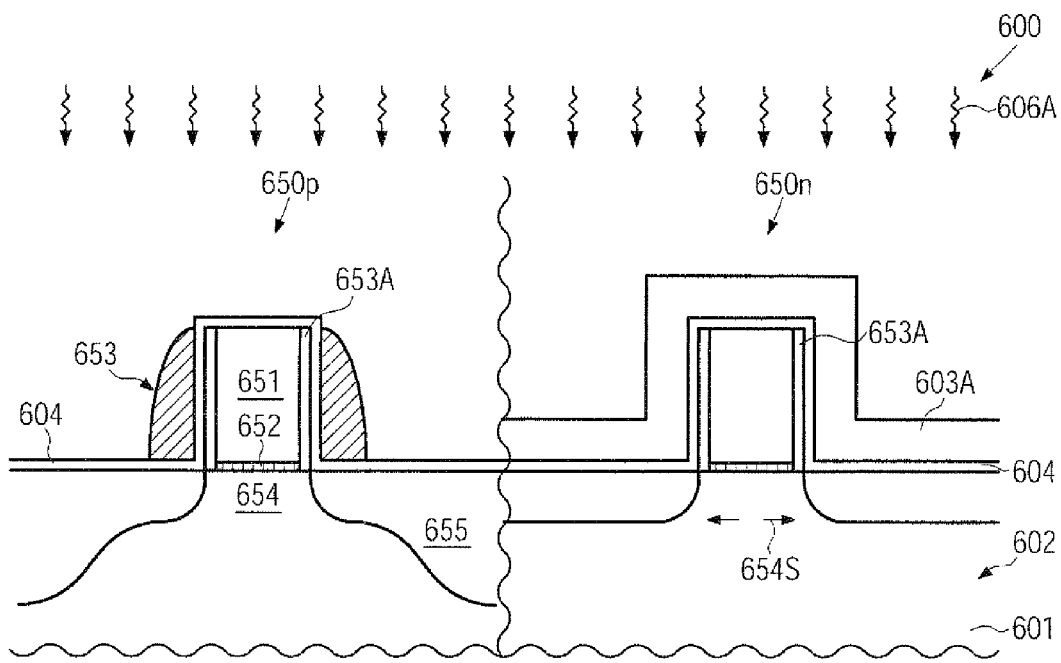

FIG. 6c schematically illustrates the device 600 after the removal of the implantation mask 605 and during an anneal process 606A. The process parameters during the process 606A may be selected such that a desired re-crystallization may be obtained in the transistors 650p, 650n, wherein a dopant diffusion may be maintained at a specific level in accordance with device requirements. For example, if a significant dopant diffusion may not be considered appropriate in this manufacturing stage, a moderately low temperature range of approximately 500-800° C. may be used or a laser-based or flashlight-based anneal technique with a reduced exposure time may be employed. Due to the presence of the patterned spacer layer 603A, the re-crystallization in the transistor 650n may be accomplished in a highly strained state, as previously explained, thereby creating the strain 654S.

Figure 6D:
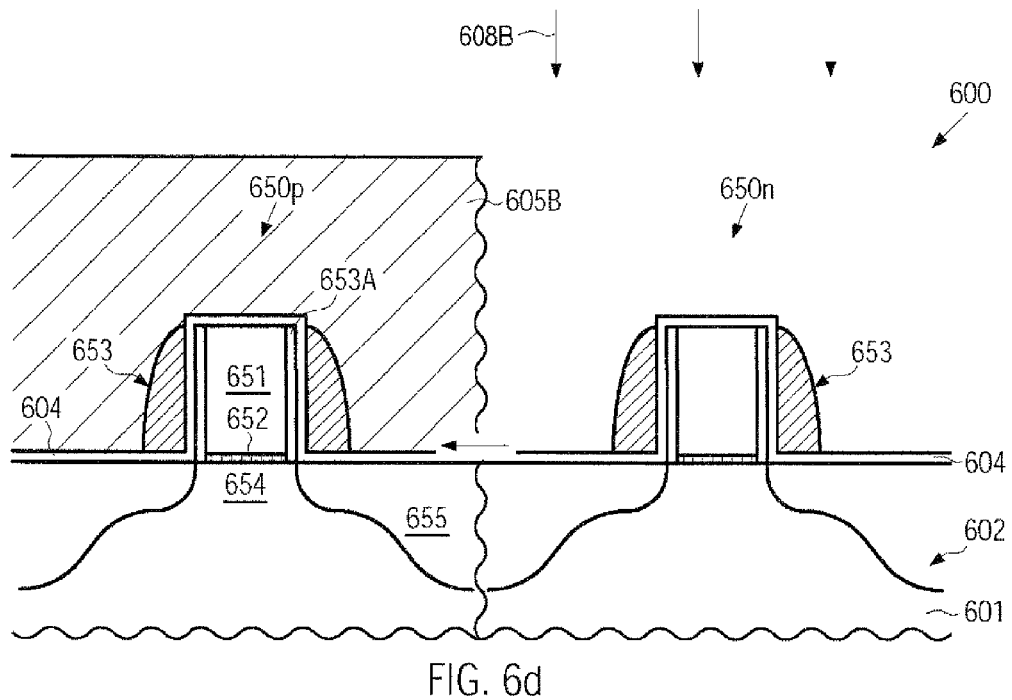

FIG. 6d schematically illustrates the device 600 in a further advanced manufacturing stage in which a further mask 605B may be provided to cover the first transistor 650p while exposing the second transistor 650n, i.e., the spacer layer 603A. Based on the mask 605B, an anisotropic etch process may be performed to obtain a spacer structure 653 and thereafter the mask 605B may be used as an implantation mask during an implantation process 608B for introducing the dopant species for defining the drain and source regions 655 in the transistor 650n. In some illustrative embodiments, the dopant species introduced into the transistor 650n may have a substantially self-amorphizing effect, thereby providing the drain and source region 655 in a substantially amorphized or at least highly damaged state. Next, the mask 605B may be removed and the further processing may be continued by forming a cap layer.

Figure 6E:
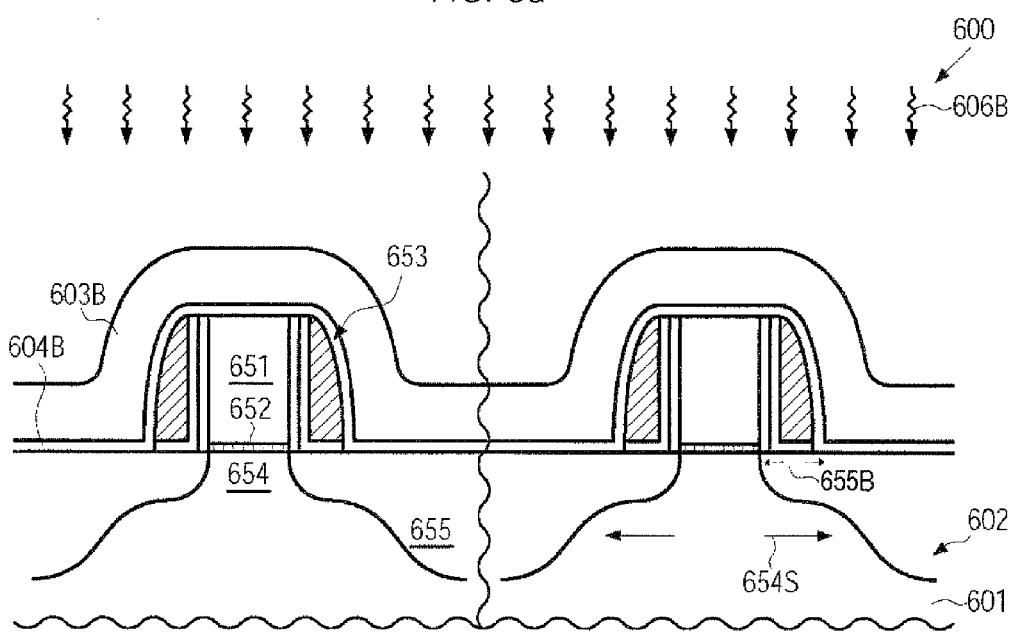

FIG. 6e schematically illustrates the device 600 with a cap layer 603B, possibly in combination with an etch stop layer 604B. Furthermore, the device 600 is subjected to a further anneal process 606B to re-crystallize the drain and source portions 655 in the second transistor 650n, wherein the presence of the cap layer 603B may provide a highly strained re-growth of the drain and source regions 655 so that, in combination with the strained extension regions 655B, an even enhanced overall strain 654S may be achieved. Thereafter, further processing may be continued by removing the cap layer 603B on the basis of process techniques as previously described and thereafter respective metal silicide regions may be formed, as previously described.

Figure 6F:
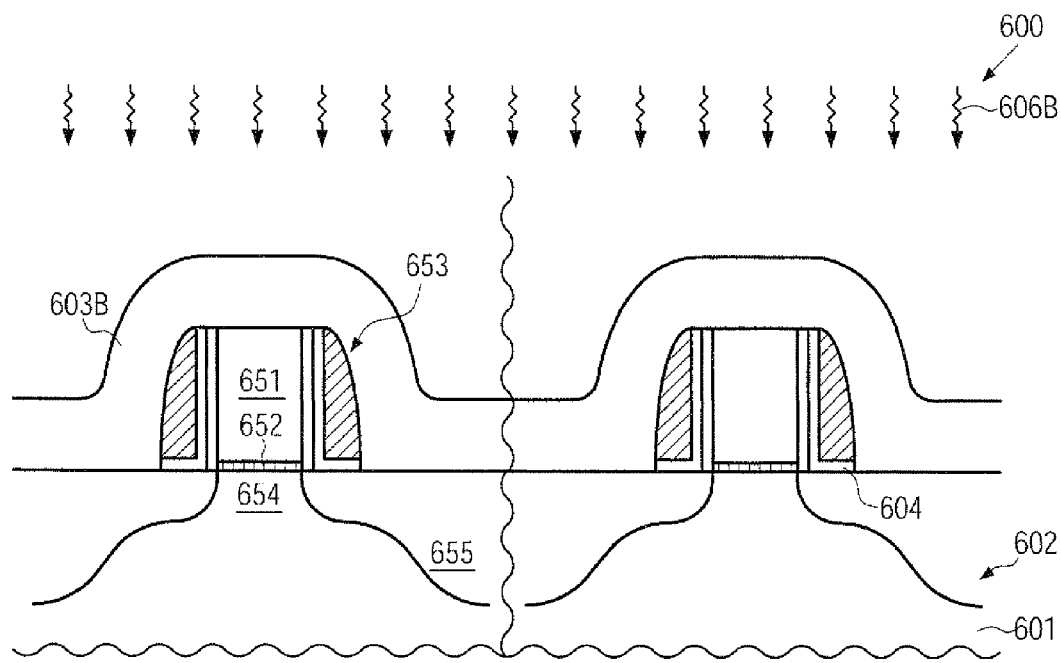

FIG. 6f schematically illustrates the device 600 according to further illustrative embodiments in which the cap layer 603B may be provided without the etch stop layer 604, wherein, in one illustrative embodiment, the layer 603B may have similar etch characteristics with respect to the spacer structures 653. Hence, after the anneal process 606B, the removal of the layer 603B may also result in the removal of the spacers 653 by using etch stop capabilities of the etch stop layer 604.

Figure 6G:
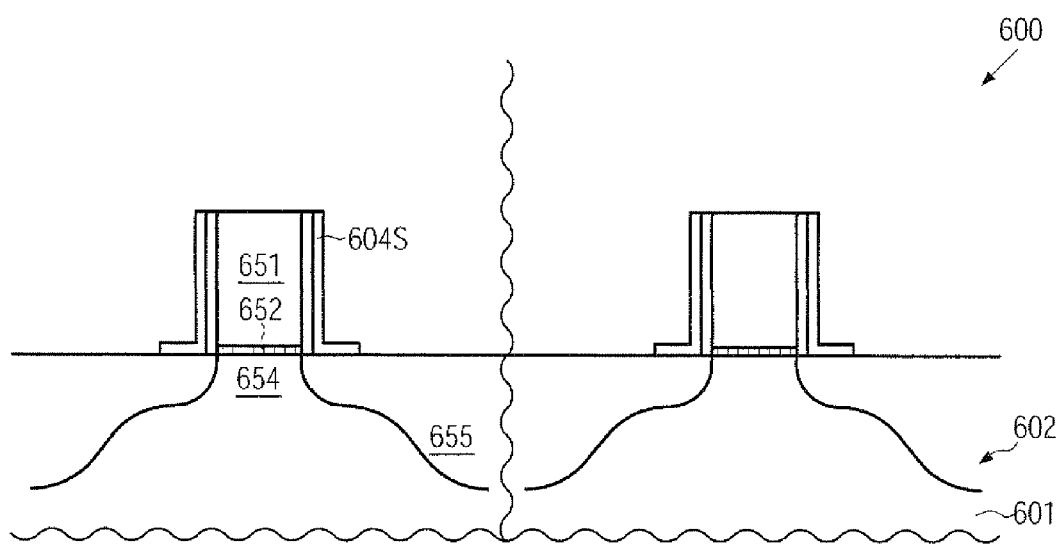

FIG. 6g schematically illustrates the device 600 after the above-described process sequence. Hence, substantially L-shaped spacers 604S may be obtained which may provide the desired self-aligned behavior during the subsequent silicidation process. Moreover, due to the removal of the spacers 653, a further stressed dielectric material, as is for instance described with reference to FIGS. 5a-5c, may be positioned more closely to the respective channel regions 654, thereby providing enhanced stress transfer capability when a further strain-inducing mechanism in the form of highly stressed dielectric material is to be provided.

As a result, the techniques disclosed herein provide selective stress memorization techniques which may be efficiently implemented in the overall manufacturing flow without requiring additional photolithography steps, thereby maintaining additional process complexity at a low level. In illustrative aspects disclosed herein, the patterning of a sacrificial cap layer may be accomplished on the basis of an implantation mask. In other cases, an additional anneal process may be performed to provide a substantially crystalline state in one type of transistor and creating a substantially non-crystalline state prior to the formation of a sacrificial cap layer, thereby also avoiding the introduction of additional photolithography steps. In other illustrative aspects, a functional layer, for instance in the form of spacer layers or highly stressed contact etch stop layers, may be used as a cap layer for creating a strained re-crystallization in one type of transistor, thereby also avoiding additional photolithography steps. In still other aspects disclosed herein, the respective concepts, for instance patterning a functional layer or a sacrificial cap layer without additional lithography steps, may be combined with additional anneal techniques for establishing a substantially crystalline state prior to the application of the selective stress memorization process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:
1. A method, comprising:
    forming an etch stop layer above a P-channel transistor and an N-channel transistor;
    forming a cap layer above said etch stop layer;
    forming a mask above said cap layer, said mask exposing a first portion of said cap layer located above said P-channel transistor and covering a second portion of said cap layer located above said N-channel transistor;
    removing at least a part of said first portion by using said etch stop layer and by using said mask as an etch mask;
    implanting a P-type dopant species into said P-channel transistor using said mask as an implantation mask;
    removing said mask;
    forming a further implantation mask covering said P-channel transistor and exposing said second portion of said cap layer;
    introducing an N-type dopant species through said second portion of said cap layer formed above said etch stop layer and into said N-channel transistor on the basis of said further implantation mask; and
    annealing said P-channel transistor and said N-channel transistor in the presence of said second portion of said cap layer formed above said etch stop layer after introducing said N-type dopant species through said second portion of said cap layer and into said N-channel transistor on the basis of said further implantation mask.
2. The method of claim 1, further comprising forming drain and source regions in a non-crystalline state in said N-channel transistor prior to forming said cap layer.

3. The method of claim 2, further comprising removing said second portion of said cap layer and forming metal silicide regions in said P-channel transistor and said N-channel transistor.

4. The method of claim 1, wherein removing at least a part of said first portion of said cap layer comprises maintaining a portion of said first portion of said cap layer to form a first sidewall spacer on sidewalls of a gate electrode structure of said P-channel transistor.

5. The method of claim 4, further comprising forming a protective layer on said first sidewall spacer prior to removing said mask covering the second portion of said cap layer.

6. The method of claim 1, further comprising forming a second sidewall spacer on sidewalls of a gate electrode of said N-channel transistor from said second portion of said cap layer after introducing said N-type dopant species.

* * * * *